(12) United States Patent
Shveykin

(10) Patent No.: US 6,748,002 B2
(45) Date of Patent: Jun. 8, 2004

(54) INJECTION LASER

(75) Inventor: Vasily I. Shveykin, Moscow (RU)

(73) Assignee: D-Led Corporation, Miami, FL (US)

( * ) Notice: Subject to any disclaimer, the term of this patent is extended or adjusted under 35 U.S.C. 154(b) by 0 days.

(21) Appl. No.: 09/781,017

(22) Filed: Feb. 9, 2001

(65) Prior Publication Data

US 2002/0012372 A1 Jan. 31, 2002

Related U.S. Application Data

(63) Continuation-in-part of application No. PCT/RU99/00275, filed on Aug. 5, 1999.

(30) Foreign Application Priority Data

Aug. 10, 1998 (RU) .......................................... 98114581

(51) Int. Cl.⁷ ............................................... H01S 5/00
(52) U.S. Cl. .............................. 372/45; 372/49; 372/50
(58) Field of Search ............................. 372/44, 45, 49, 372/50, 99, 96

(56) References Cited

U.S. PATENT DOCUMENTS

| | | | |
|---|---|---|---|
| 4,063,189 A | 12/1977 | Scifres et al. | |
| 5,101,413 A | 3/1992 | Botez | |
| 5,537,433 A | 7/1996 | Watanabe | |
| 5,705,834 A | 1/1998 | Egalon et al. | |
| 5,779,924 A | 7/1998 | Krames et al. | |
| 5,793,062 A | 8/1998 | Kish, Jr. et al. | |
| 5,818,860 A | 10/1998 | Garbuzov et al. | |
| 6,057,562 A | 5/2000 | Lee et al. | |
| 6,429,462 B1 | 8/2002 | Shveykin | |

FOREIGN PATENT DOCUMENTS

| | | |
|---|---|---|
| EP | 0 247 267 B1 | 10/1991 |
| EP | 0727827 A3 | 2/1996 |
| EP | 0849812 A3 | 6/1998 |
| JP | 60-211993 | 10/1985 |
| RU | 1359833 A1 | 12/1987 |
| RU | 1455373 | 1/1989 |
| RU | 1329533 A1 | 5/1998 |
| RU | 2133534 | 7/1999 |
| RU | 2134007 | 7/1999 |
| RU | 2142661 | 12/1999 |
| RU | 2142665 | 12/1999 |
| WO | WO 85/03809 A1 | 8/1985 |
| WO | WO 99/08352 | 2/1999 |
| WO | WO 99/46838 | 9/1999 |
| WO | WO 00/10235 | 2/2000 |
| WO | WO 00/39860 | 7/2000 |

OTHER PUBLICATIONS

High Efficiency *InGaAlP Visible Light–Emitting Diodes*, H. Sugawara, et al., *Japanese Journal of Applied Physics*, vol. 31, No. 8, Aug. 1992, pp. 2446–2451.

Room–Temperature *CW Operation of InGaAsP on Si Fabricated by Wafer Bonding*, H. Wada et al., *IEEE Photonics Technology Letters*, vol. 8 No. 2, Feb. 1996, pp. 173–175.

*Chemically Assisted Ion Beam Etching of GaAs, Ti, and Mo*, J. D. Chinn et al, *J. Vac. Sci. Technol. A*, vol. 1, No. 2, Apr.–Jun. 1983, pp. 701–704.

(List continued on next page.)

Primary Examiner—Minh Loan Tran
(74) Attorney, Agent, or Firm—Knobbe, Martens, Olson & Bear, LLP

(57) ABSTRACT

An injection laser comprises a laser heterostructure, at least one radiation inflow region adjoining the laser heterostructure, and reflectors that together form an optical resonator. The laser heterostructure comprises an active layer, cladding layers, and ohmic contacts. The radiation inflow region adjoining the laser heterostructure is transparent to the laser radiation and is located on at least one side of the active layer. The radiation inflow region additionally includes at least one optical facet, an outer surface, and an inner surface. Radiation generated in the active layer flows into the radiation inflow region and exits the laser.

55 Claims, 10 Drawing Sheets

OTHER PUBLICATIONS

*High–Power Superluminescent Diodes*, G. A. Alphonse et al., *IEEE Journal of Quantum Electronics*, vol. 24, No. 12, Dec. 1988, pp. 2454–2457.

*Thin–Films Field–Transfer Matrix Theory of Planar Multilayer Waveguides and Reflection From Prism–Loades Waveguides*, J. Chilwell et al., *Journal of the Optical Society of America*, vol. 1, No. 7, Jul. 1984, pp. 742–753.

*Wide Spectrum Single Quantum Well Superliminescent Diodes at 0.8 mm With Bent Optical Waveguide*, A. T. Semenov et al., *Electronics Letters*, vol. 29, No. 10, May 13, 1993, pp. 854–855.

*Superluminescent Diodes with Bent Waveguide*, C.–F. Lin et al., *IEEE Photonics Technology Letters*, vol. 8, No. 2, Feb. 1996, pp. 206–208.

*Low spectral modulation high–power output from a new AlGaAs superluminescent diode/optical amplifier structure*, G. A. Alphonse et al., *Applied Physics Letters*, vol. 55, No. 22, Nov. 27, 1989, pp. 2289–2291.

*P–GaN/N–InGaN/N–GaN Double Heterostructure Blue-Light Emittin Diodes*, S. Nakamura et al., *Japanese Journal of Applied Physics*, vol. 32, Part 2, No. 1A/B, Jan. 15, 1993, pp. L8–L11.

*High–Brightness AlGaInP 573–nm Light–Emitting Diode with a Chirped Multiquantum Barrier*, C. S. Chang et al., *IEEE Journal of Quantum Electronics*, vol. 34, No. 1, Jan. 1998, pp. 77–83.

Very high–efficiency semiconductor wafer–bonded transparent–substrate ($Al_xGa_{1-x}$)$_{0.5}In_{0.5}$P/GaP light–emitting diodes, F. A. Kish et al., *Applied Physics Letters*, vol. 64, No. 21, May 23, 1994, pp. 2839–2841.

Superbright Green InGaN Single–Quantum–Well–Structure Light–Emitting Diodes, S. Nakamura et al., *Japanese Journal of Applied Physics*, vol. 34 (1995) pp. L1332–L1335, Part 2, No. 10B, Oct. 15, 1995.

Internal Optical Losses in Very Thin CW Heterojunction Laser Diodes, J. K. Butler et al., *IEEE Journal of Quantum Electronics*, vol. QE–11, No. 7, Jul. 1975 pp. 402–408.

Room–Temperature CW Operation of InGaAsP Lasers on Si Fabricated by Wafer Bonding, H. Wada et al., *IEEE Photonics Technology Letters*, vol. 8, No. 2, Feb. 1996, pp. 173–175.

Optoelektronika [Optoelectronics], Yu. R. Nosov, *Radio i svyaz*, [Radio and Communications], Moscow, Publ. (1989), pp. 136–143.

Light–Emitting Diodes with 17% External Quantum Efficiency at 622 Mb/s for High–Bandwidth Parallel Short–Distance Optical Interconnects, R. H. Windisch et al., *IEEE Journal of Selected Topics in Quantum Electronics*, vol. 5, No. 2, Mar./Apr. 1999, pp. 166–171.

High Brightness Visible (660 nm) Resonant–Cavity Light-Emitting Diode, K. Streubel et al., *IEEE Photonics Technology Letters*, vol. 10, No. 12, Dec. 1998, pp. 1685–1687.

100–mW High–Power Angled–Stripe Superluminescent Diodes with a New Real Refractive–Index–Guided Self-Aligned Structure, T. Takayama et al., *IEEE Journal of Quantum Electronics*, vol. 32, No. 11, Nov. 1996, pp. 1981–1987.

High–power, high–efficiency, 1.3 mm superluminescent diodes with a buried absorbing guide structrure, Hauro Nagai et al., *Applied Physics Letters*, vol. 54, No. 18, May 1989, pp. 1719–1721.

High power, high efficiency window buried heterostructure GaAlAs superluminescent diode with an integrated absorber, N. S. K. Kwong et al., *Applied Physics Letters*, vol. 51, No. 23, Dec. 7, 1987, pp. 1879–1881.

Optical Properties of a GaA/As Superluminescent Diode, N. K. Duttsa et al., *IEEE Journal of Quantum Electronics*, vol. QE–19, No. 4, Apr. 1983, pp. 496–498.

Measurement of the Modal Reflectivity of an Antireflection Coating on a Superluminescent Diode, I. P. Kaminow et al., *IEEE Journal of Quantum Electronics*, vol. QE–19, No. 4, Apr. 1983, pp. 493–495.

98–nm Master Oscillator Power Amplifiers with Nonabsorbing Mirrors, R. M. Lammert et al., *IEEE Photonics Technology Letters*, vol. 11, No. 9, Sep. 1999, pp. 1099–1101.

High–Power Near–Diffraction–Limited Tapered Amplifers at 1064 nm for Optical Intersatellite Communications, P. Chazan et al., *IEEE Photonics Technology Letters*, vol. 10, No. 11, Nov. 1998, pp. 1542–1544.

Extremely Low Power Consumption Semiconductor Optical Amplifier Gate for WDM Applicatins, T. Ito et al., *Electronics Letters*, vol. 33, No. 21, Oct. 9, 1997, pp. 1791–1792.

5–W CW Diffraction–Limited InGaAs Broad–Area Flared Amplifier at 970 nm, S. O'Brien et al., *IEEE Photonics Technology Letters*, vol. 9, No. 9, Sep. 1997, pp. 1217–1219.

Wavelength Conversion Using Semiconductor Optical Amplifiers, M. Asghari et al., *Journal of Lightwave Technology*, vol. 15, No. 7, Jul. 1997, pp. 1181–1190.

Gain Dynamics of a Saturated Semiconductor Laser Amplifier with 1.47–mm LD Pumping, K. Inoue et al., *IEEE Photonics Technology Letters*, vol. 8, No. 4, Apr. 1996, pp. 506–508.

Improvement of Saturation of Output Power in a Semiconductor Laser Amplifier through Pumping Light Injection, M. Yoshino et al., *IEEE Photonics Technology Letters*, vol. 8, No. 1, Jan. 1996, pp. 58–59.

Progress in Long–Wavelength Strained–Layer InGaAs(P) Quantum–Well Semiconductor Laser and Amplifiers, P. J. A. Thijs et al., *IEEE Journal of Quantum Electronics*, vol. 30 No. 2, Feb. 1994, pp. 477–499.

5.25–W CW Near–Diffraction–Limited Tapered Stripe Semiconductor Optical Amplifier, D. Mehuys et al., *IEEE Photonics Technology Letters*, vol. 5, No. 10, Oct. 1993, pp. 1179–1182.

High–Power Diffraction–Limited Monolithic Broad Area Master Oscillator Power Amplifier, S. O'Brien et al., *IEEE Photonics Technology Letters*, vol. 5, No. 5, May 1993, pp. 526–528.

2.0 W CW, Diffraction–Limited Operation of a Monolithically Integrated Master Oscillator Power Amplifier, R. Parke et al., *IEEE Photonics Technology Letters*, vol. 5, No. 3, Mar. 1993, pp. 297–300.

2.0 W CW, Diffraction–Limited Tapered Amplifier with Diode Injection, D. Mehuys et al., *Electronics Letters*, vol. 28, No. 21, Oct. 8, 992, pp. 1944–1946.

Semiconductor Optical Amplifiers, N. Anders Olsson, *Proceedings of IEEE*, vol. 80, No. 3, Mar. 1992, pp. 375–382.

Ultra–Low–Reflectivity Semiconductor Optical Amplifiers Without Antireflection Coatings, W. Rideout et al., *Electronics Letters*, vol. 26, No. 1, Jan. 4, 1990, pp. 36–38.

546 km, 140 Mbits/s FSK Coherent Transmission Experiment through 10 Cascaded Semiconductor Laser Amplifiers, S. Ryu et al., *Electronics Letters*, vol. 25, No. 25, Dec. 7, 1989, pp. 1682–1684.

Pulse Energy Gain Saturation in Subpico- and Picosecond Pulse Amplification by a Traveling–Wave Semiconductor Laser Ampifier, T. Saitoh et al., *IEEE Photonics Technology Letters*, vol. 1, No. 10, Oct. 1989, pp. 297–299.

Polarization–Independent Optical Amplifier with Buried Facets, N. A. Olsson et al., *Electronics Letters*, vol. 25, No. 16, Aug. 3, 1989, pp. 1048–1049.

Gain and Noise Characteristics of a 1.5mm Near–travelling–wave Semiconductor Laser Amplifier, J.–C. Simon et al., *Electronics Letters*, vol. 25, No. 7, Mar. 30, 1989, pp. 434–436.

1.3mm Semiconductor Laser Power Amplifier, N. A. Olsson et al., *IEEE Photonics Technology Letters*, vol. 1, No. 1, Jan. 1989, pp. 2–3.

Semiconductor Laser Optical Amplifiers for Use in Future Fiber Systems, M. J. O'Mahony, *Journal of Lightwave Technology*, vol. 6, No. 4, Apr. 1988, pp. 531–544.

New Inline Wideband Dynamic Semiconductor Laser Amplifier Model, A. Lowery, *IEEE Proceedings*, vol. 135, Pt. J, No. 3, Jun. 1988, pp. 242–250.

Recent Progress in Semiconductor Laser Amplifiers, Tadashi Saitoh et al., Journal of Lightwave Technology, vol. 6, No. 11, Nov. 1988, pp. 1656–1664.

Fabrication and Performance of 1.5mm GaInAsP Travelling wave Laser Amplifiers with Angled Facets, C.E. Zah et al., *Electronics Letters*, vol. 23, No. 19, Sep. 10, 1987 pp. 990–991.

Travelling–wave Optical Amplifier at 1.3mm, G. Eisenstein et al., *Electronics Letters*, vol. 23, No. 19, Sep. 10, 1987, pp. 1020–1022.

Optical FM Signal Amplification by Injection Locked and Resonant Type Semiconductor Laser Amplifiers, S. Kobayashi et al., *IEEE Transactions on Microwave Theory and Techniques*, vol. MTT–30, No. 4, Apr. 1982, pp. 421–427.

Efficient high power reliable InGaAs/GaAs (940nm) monolithic laser diode arrays, X. He et al., *Electronics Letters*, vol. 35, No. 20, Sep. 30, 1999, pp. 1739–1740.

Effects of broad–waveguide structure in 0.8 mm high–power InGaAsP/InGaP/A/GaAs lasers, T. Hayakawa et al., *Applied Physics Letters*, vol. 75, No. 13, Sep. 27, 1999, pp. 1839–1841.

Very high power 1.48 mm semiconductor lasers, A. Mathur et al., *Electronics Letters*, vol. 35, No. 2, Jun. 10, 1999, pp. 983–985.

High–power and high temperature long–term stability of Al–free 950nm laser structures on GaAs, G. Beister et al., *Electronics Letters*, vol. 35, No. 19, Sep. 16, 1999, pp. 1641–1643.

Ghost Modes and Resonant Effects in AlGaN–InGaN–GaN Lasers, P. G. Eliseev et al., *IEEE Journal of Selected Topics in Quantum Electronics*, vol. 5, No. 3, May/Jun. 1999, pp. 771–779.

10.9W continuous wave optical power from 100mm aperture InGaAs/AlGaAs (915nm) laser diodes, X.He et al., *Electronics Letters*, vol. 34, No. 22, Oct. 29, 1998, pp. 2126–2127.

High–power (>10 W) continuous–wave operation from 100–mm–aperture 0.97–mm–emitting Al–free diode lasers, A. Al–Muhanna et al., Applied Physics Letters, vol. 73, No. 9, Aug. 31, 1998, pp. 1182–1184.

High–Power High–Efficiency 0.98–mm Wavelength InGaAs–(In)GaAs(P)–InGaP Broadened Waveguide Lasers Grown by Gas–Source Molecular Beam Epitaxy, M. R. Gokhale et al., *IEEE Journal of Quantum Electronics*, vol. 33, No. 12, Dec. 1997, pp. 2266–2276.

9.3 W CW (In)AIGaAs 100mm wide lasers at 970nm, S. O'Brien et al., *Electronics Letters*, vol. 33, No. 22, Oct. 23, 1997, pp. 1869–1871.

66% CW wallplug efficiency from Al–fre 0.98mm–emitting diode lasers, D. Botez et al., *Electronics Letters*vol. 32, No. 21, Oct. 10, 1996, pp. 2012–2013.

A Novel Cladding Structure fro Semiconductor Quantum–Well Lasers with Small Beam Divergence and Low Threshold Current, S. Yen et al., *IEEE Journal of Quantum Electronics*, vol. 32, No. 9, Sep. 1996, pp. 4588–1595.

InGaP/InGaAsP/GaAs 0.808 mm Separate Confinement Laser Diodes Growth by Metalorganic Chemical Vapor Deposition, J. Diaz et al., *IEEE Photonics Technology Letters*, vol. 6, No. 2, Feb. 1994, pp. 132–134.

Aluminum–Free 980–nm GaIN/GaInAsP/GaInP Pump Lasers, Harry Asonen et al., *IEEE Journal of Quantum Electronics*, vol. 30, No. 2, Feb. 1994, pp. 415–423.

600 mW CW Single–Mode GaAIAs Triple–Quantum–Well Laser with a New Index Guided Structure, O. Imafuji et al., *IEEE Journal of Quantum Electronics*, vol. 29, No. 6, Jun. 1993, pp. 1889–1894.

Leaky wave room–temperature double heterostructure GaAs:gAaIAs diode laser, D. R. Scifres et al., *Applied Physics Letters*, vol. 29, No. 1, Jul. 1976, pp. 23–25.

Operating Characteristics of High–Power Monolithically Integrated Flared Amplifier Master Oscillator Power Amplifier, S. O'Brien et al., *IEEE Journal of Quantum Electronics*, vol. 29, No. 6, Jun. 1993, pp. 2052–2057.

High–Power 1.3–mm InGaAsP–InP Amplifiers with Tapered Gain Regions, J.P. Donnelly et al., *IEEE Photonics Technology Letters*, vol. 8, No. 11, Nov. 1996, pp. 1450–1452.

High–Power, Near–Diffraction–Limited Large–Area Traveling–Wave Semiconductor Amplifier, L. Goldberg et al., *IEEE Journal of Quantum Electronics*, vol. 29, No. 6, Jun. 1993, pp. 2028–2043.

The carrier effects on the change of refractive index for n–type GaAs at $\lambda$+1.06, 1.3, and 1.55 $\mu m$, H.C. Huang et al., *Journal of Applied Physics*, vol. 67, No. 3, Feb. 1, 1990, pp. 1497–1503.

Monolithic Super–Bright Red Resonant Cavity Light–Emitting Diode Grown by Solid Source Molecular Beam Epitaxy, M. Jalonen et al., *IEEE Photonics Technology Letters*, vol. 10, No. 7, Jul. 1998, pp. 923–925.

1.1 W CW, Diffraction–Limited Operation of a Monolithically Integrated Flared–Amplifier Master Oscillator Power Amplifer, D.F. Welch et al., *Electronics Letters*, vol. 28, No. 21, Oct. 8, 1992, pp. 2011–2013.

High–Power InGaAs/GaAs Singlemode Laser Diodes With Reactive–Ion–Etched Ridges, S.S. Ou et al., *Electronics Letters*, vol. 28, No. 25, Dec. 3, 1992, pp. 2345–2346.

*Oxidized GaAs QW vertical–cavity lasers with 40* power conversion efficiency, B. Weigl et al., *Electronics Letters*, vol. 32, No. 19, Sep. 12, 1996, pp. 1784–1786.

*Depressed index cladding barrier separate confinement single quantum well heterostructure laser*, T. M. Cockerill et al., *Applied Physics Letters*, vol. 59, No. 21, Nov. 18, 1991, pp. 2694–2696.

*Linewidth Broadening Factor in Semiconductor Lasers–An Overview*, M. Osinski et al., *IEEE Journal of Quantum Electronics*, vol. QE–23, No. 1, Jan. 1987, pp. 9–29.

*Nature of Wavelength Chirping in Directly Modulated Semiconductor Lasers*, T. L. Koch et al., *Electronics Letters*, Dec. 6, 1984, vol. 20, No. 25/26, pp. 1038–1039.

*Handbook of Semiconductor Lasers and Photonic Integrated Circuits*, Y. Suematsu et al., 1994, pp. 402–407.

*Handbook of Semiconductor Lasers and Photonic Integrated Circuits*, Y. Suematsu et al., 1994, pp. 44–45, 393–417.

*Handbook of Semiconductor Lasers and Photonic Integrated Circuits*, Y. Suematsu et al., 1994, pp. 58–65.

*Resonant Cavity LED's Optimized for Coupling to Polymer Optical Fibers*, R. Bockstaele et al., *IEEE Photonics Technology Letters*, vol. 11, No. 2, Feb. 1999, pp. 158–160.

*High–power 1.3 μm superlujinescent diode*, N. S. K. Kwong et al., *Applied Physics Letters*, vol. 54, No. 4, Jan. 23, 1989, pp. 298–300.

*Analysis of Semiconductor Laser Optical Amplifiers*, M. J. Adams et al., *IEEE Proceedings*, vol. 132, Pt. J. No. 1, Feb. 1985, pp. 58–63.

*Efficiency and intensity distribution of a semiconductor leaky–mode laser*, A.P. Bogatov et l., *Quantum Electronics*, vol. 26, No. 1, 1999, pp. 28–32 (In Russia).

*Directional radiation pattern of quantum–dimensional InCaAs/GaAs leaky–mode lasers*, V.I. Shveikin et al., *Quantum Electronics*, vol. 26, No. 1, 1999, pp. 33–36, (In Russian).

*Dynamics of the optical damage of output mirrors of ridge semiconductor lasers based on strained quantum–well heterostructures*, I.V. Akimova et al., *Quantum Electronics*, vol. 28, No. 7, 1998, pp. 629–632.

*ADC's Epitaxial Mirror on Facet Process Improves 980 nm Pump Laser Reliability*, Tim Whitaker, *Compound Semiconductor*, vol. 6, No. 5, Jul. 2000, pp. 52–53.

Abstract of Russian Patent #RU 2133534 obtained from Delphion database (www.delphion. com).

*Semiconductor lasers emitting at the 0.98 μm wavelength with radiation coupling–out through the substrate*, Quantum Electronics, vol. 28, No. 7, 1998, pp. 605–607.

*GaN microdisk light emitting diodes*, S. X. Jin et al., *Applied Physics Letters*, vol. 76, No. 5, Jan. 31, 2000, pp. 631–633.

*Improved characteristics of InGaN multiple–quantum–well light–emitting by GaN/NaIGaN distributed Bragg reflector grown on sapphire*, N. Nakada et al., *Applied Physics Letters*, vol. 76, No. 14, Apr. 3, 2000, pp. 1804–1806.

*Room–temperature operation at 333 nm of $AI0.03\ Ga_{0.75}\ N$ quantum–well light–emitting diodes with Mg–doped superlattice layers*, *Applied Physics Letters*, vol. 77, No. 2, Jul. 10, 2000, pp. 175–177.

*Resonant–cavity InGaN quantum–well blue light–emitting diodes*, Y.–K. song et al., *Applied Physics Letters*, vol. 77, No. 12, Sep. 18, 2000, pp.1744–1746.

*Green electroluminescent (Ga, In, Ai) N LEDs grown on Si (111)*, S. Dalmasso et al., *Electronics Letters*, vol. 36, No. 20, Sep. 28, 2000, pp. 1728–1730.

*High–efficiency, low voltage resonant–cavity light–emitting diodes operating around 650 nm*J. W. Gray et al., *Electronics Letters*, vol. 36, No. 20, Sep. 28, 2000, pp. 1730–1731.

*Semiconductor Optical Amplifiers*, J.–R. Kim et al., *Compound Semiconductor*, vol. 6, No. 2, Mar. 2000, pp. 46–48, 50.

*U.S. Patent Application No. 09/781,017 entitled "Semiconductor Optical Amplifer".*

INJECTION LASER

RELATED APPLICATIONS

This application is a continuation-in-part of International Application No. PCT/RU99/00275 filed at the Russian Receiving Office on Aug. 5, 1999, published in a language other than English under PCT Article 21(2) as WO 00/10235 on Feb. 24, 2000. Accordingly, priority under §365(c) is claimed to International Application No. PCT/RU99/00275 filed Aug. 5, 1999. Additionally, priority under §119 is claimed to Russian Patent Application No. 98114581 (now Patent No. 2142665) filed Aug. 10, 1998.

FIELD OF THE INVENTION

The invention relates to quantum electronic technology, and more specifically to efficient semiconductor sources of radiation with a narrow radiation patterns.

BACKGROUND OF INVENTION

The injection laser (hereinafter referred to as "the laser") is a device that converts electrical energy into the light possessing a narrow spectral composition and high directivity.

Different types of lasers are known: lasers with a strip-type active lasing region and with radiation output through the mirror of an optical resonator (S. S. Ou et. al., *Electronics Letters* (1992), Vol. 28, No. 25, pp. 2345–2346), distributed-feedback lasers (*Handbook of Semiconductor Lasers and Photonic Integrated Circuits*, edited by Y. Suematsu and A. R. Adams, Chapman-Hill, London, 1994, pp. 44–45 and 393–417), laser amplifiers, including a master oscillator power amplifier (MOPA) (*IEEE J. of Quantum Electronics* (1993), Vol. 29, No. 6, pp. 2052–2057), and lasers with curved resonators and radiation output through a surface (*Electronics Letters* (1992), Vol. 28, No. 21, pp. 3011–3012). Further expansion of the applications of such lasers is impeded by insufficiently high output power, efficiency, operating life, and reliability, including situations with monomode lasing.

The laser described in U.S. Pat. No. 4,063,189, issued to D. R. Scifres et al. in 1977 includes a laser heterostructure (hereinafter referred to as a "heterostructure") that contains an active layer of GaAs positioned between two optically homogeneous cladding layers. The gain region of the operating laser, of length $L_{GR}$, in practice coincides with the thick active layer into which non-equilibrium carriers are injected by means of ohmic contacts. As the term is conventionally employed, a gain region is that part of the heterostructure which includes the active layer and from which radiation is spreading in a activated laser. The gain region, hereinafter referred to as "the GR", is the medium of the optical resonator. The length of the GR along the longitudinal gain axis is bounded by flat end surfaces that act as reflectors. The length $L_{OR}$ of the optical resonator (Fabry-Perot) coincides with the length $L_{GR}$, so that the ratio $$\mu = L_{OR}/L_{GR} \qquad (1)$$

is equal to one. Reflective coatings with a coefficient of reflection close to one (hereinafter referred to as "reflective coating") are applied to the reflectors of the optical resonator. The radiation inflow region (hereinafter referred to as "RIR"), as which a substrate of GaAs is used, borders on a surface of one of the cladding layers that is distant from the active layer. The inner surface of the RIR, whose area is equal to the area of the GR, is located on the cladding layer adjacent to the RIR. The flat optical facets of the RIR are a continuation of the planes of the reflectors of the optical resonator and are perpendicular to the longitudinal gain axis of the GR. A coating with a reflection coefficient close to zero (hereinafter referred to as "antireflective coating") is applied to one of the optical facets (hereinafter referred to as "the facet"), while a reflective coating is applied to the other facet. The facet with the applied anti-reflective coating is the output surface. The RIR is made electrically conductive, and an ohmic contact is made with its outer surface, which is opposite the inner surface. Another ohmic contact is made from the direction of the heterostructure.

When direct current is supplied to the laser, nonequilibrium carriers are injected into the active layer, and induce the generation of radiation of a specified wavelength λ and mode composition in the medium of the optical resonator. Part of the laser radiation from the GR exits the laser through the RIR. The angle of outflow of radiation is define by the following equation:

$$\phi = \arccos(n_{\mathit{eff}}/n_{RIR}) \qquad (2)$$

(see J. K. Buttler et al., *IEEE Journ. of Quant. Electron.* (1975), Vol. QE-11, p. 402). Note that the use of identical compositions for the active layer and RIR (both made of GaAs) restricted the range of ratios $n_{\mathit{eff}}/n_{RIR}$ from more than 0.9986 to 1, and the outflow angle φ to the range from 3° to 0°, respectively.

The following basic parameters were obtained for the fabricated laser (see D. R. Scifres et al., U.S. Pat. No. 4,063,189, 1977, as well as D. R. Scifres et al., *Applied Physics Letters* (1976), Vol. 29, No. 1, pp. 23–25): a threshold current density $j_{thr}$ of 7.7 kA/cm², a threshold current $J_{thr}$ of 7.0 A for a length $L_{OR}$ of 400 μm, a short-pulse output power of 3 W, a differential efficiency on the order of 35–40%, and an angle of divergence Θ of 2°₁ in the vertical plane for laser radiation output through the face. The vertical plane referred to is the plane that passes through the longitudinal gain axis and that is perpendicular to the active layer. The corresponding horizontal plane is perpendicular to the vertical plane.

SUMMARY OF THE INVENTION

An injection laser comprising at least one gain region having a longitudinal gain axis and outputting laser radiation at an outflow angle φ comprises a laser heterostructure, at least one radiation inflow region adjoining the laser heterostructure, and reflectors that together form an optical resonator. The laser heterostructure comprises an active layer, which forms at least one of the gain regions, cladding layers comprising at least one layer having a refractive index, and ohmic contacts. The radiation inflow region adjoining the laser heterostructure is transparent to the laser radiation, has a refractive index $n_{RIR}$, and is located on at least one side of the active layer. The radiation inflow region additionally includes at least one optical facet, an outer surface, and an inner surface, the optical facet being oriented at an angle of inclination ψ with respect to a plane perpendicular to the longitudinal gain axis. At least part of the optical resonator coincides with at least part of the radiation inflow region and at least part of the gain region. The laser heterostructure and the adjoining radiation inflow region together have an effective refractive index $n_{eff}$ such that $n_{RIR}$ exceeds $n_{eff}$, $\arccos(n_{eff}/n_{RIR}) \leq \arccos(n_{eff\text{-}min}/n_{RJR})$, and $n_{eff\text{-}min}$ is greater than $n_{min}$, where $n_{eff\text{-}min}$ is the minimum value of $n_{eff}$ for laser heterostructures with radiation inflow regions that produce outflow of radiation from the active layer into the radiation inflow region, and $n_{min}$ is the smallest of the refractive indices in the cladding layers of the heterostructure.

Figure 1:
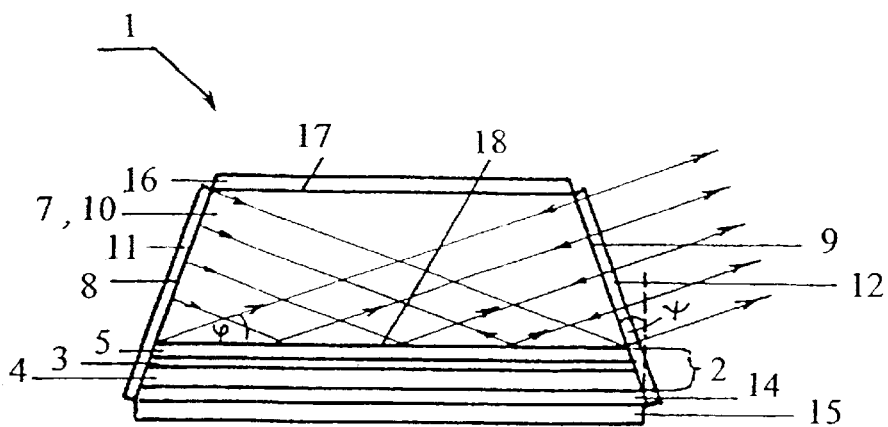
FIGS. 1–7 schematically depict longitudinal sections (along the optical gain axis of the GR) of different designs of lasers with GR end surfaces made in the form of planes that extend the planes of the corresponding facets of the RIR, and with one-way radiation output.
Figure 2:
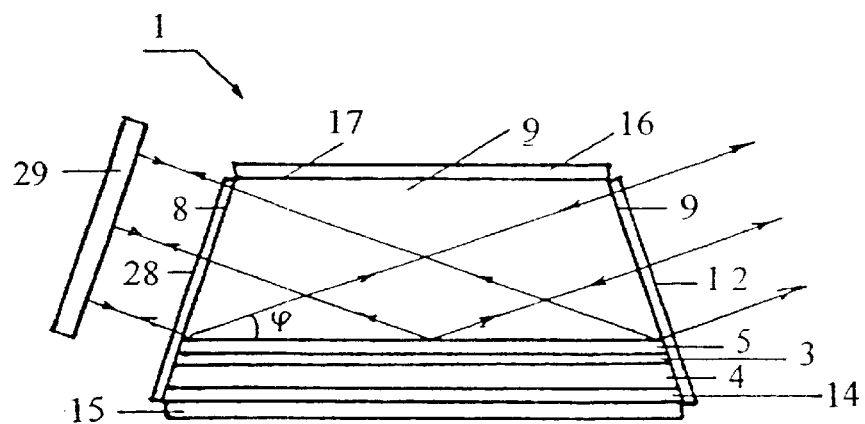
Figure 3:
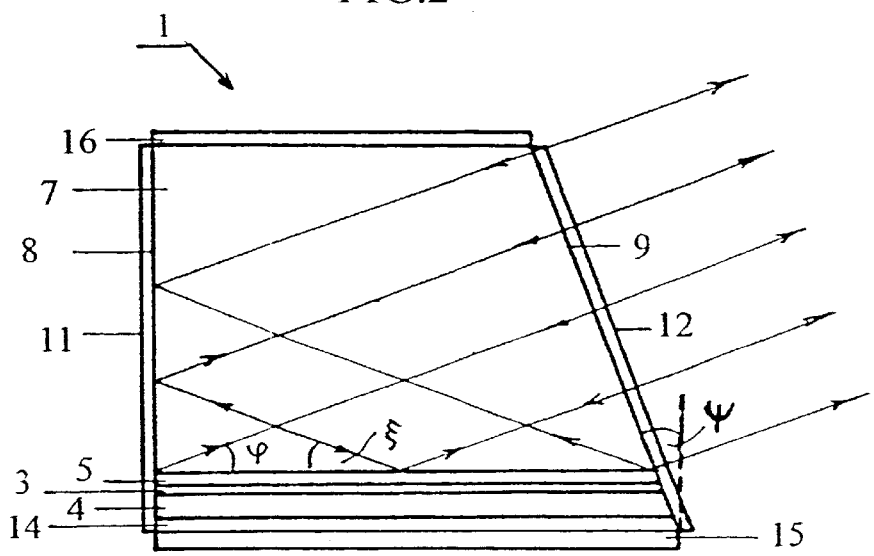
Figure 4:
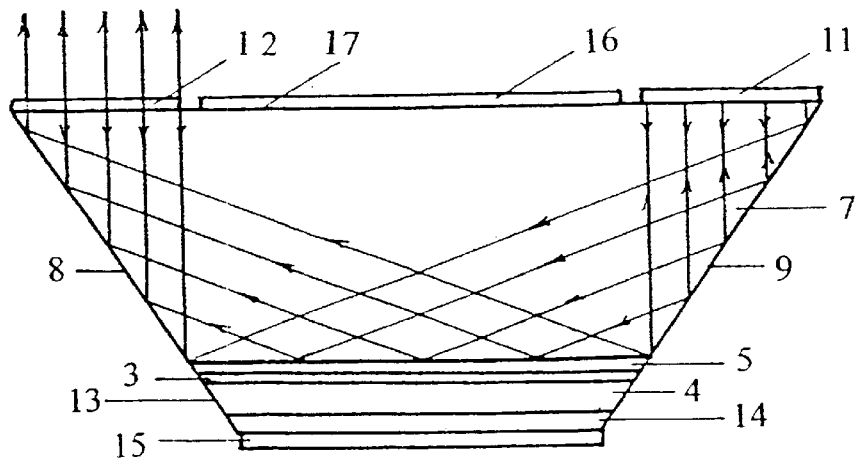
Figure 5:
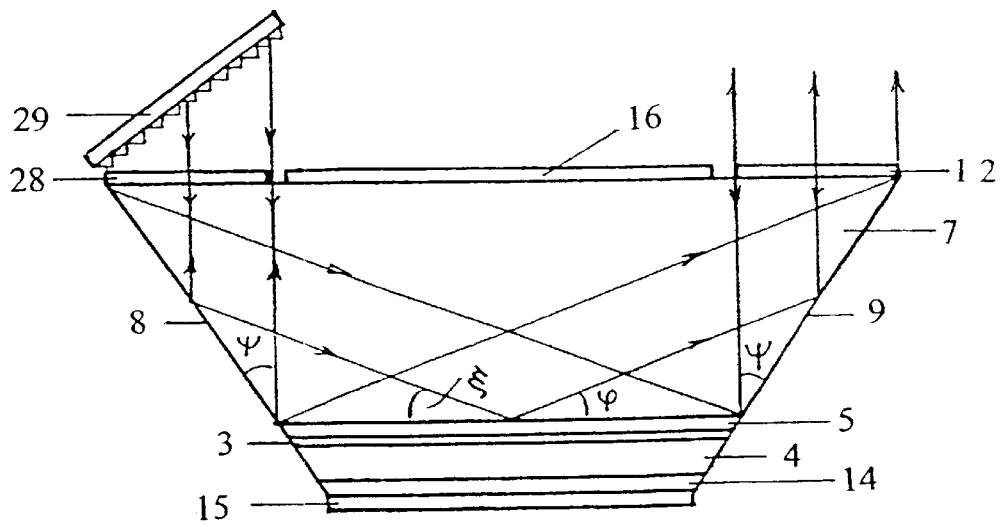
Figure 6:
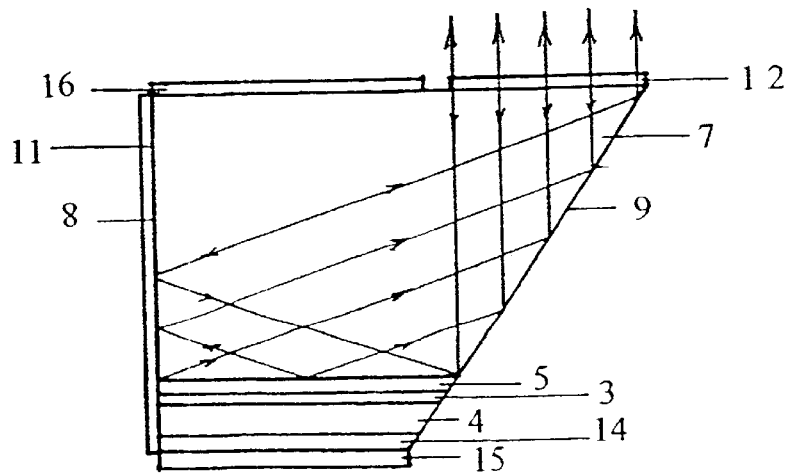
Figure 7:
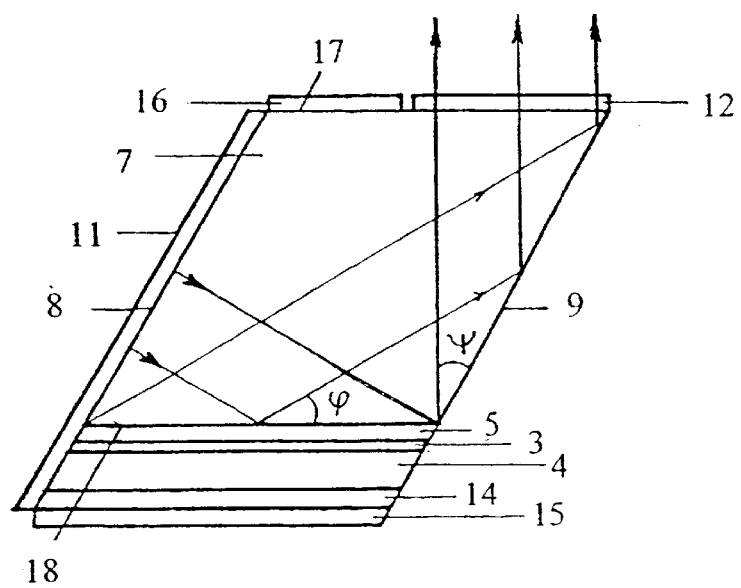

Specifically, in FIGS. 1–3, the facets of the RIR are implemented as reflectors of the optical resonator;

in FIG. 1, the laser has two inclined facets all shown with a positive angle of inclination ψ equal to φ;

in FIG. 2, the laser includes an external reflector in the form of a plane mirror to one of the inclined facets; and in FIG. 3, the laser has one facet with an angle of inclination ψ equal to zero;

FIGS. 4–7 depict lasers wherein parts of the outer surface of the RIR that are implemented as reflectors of the resonator;

in FIG. 4, the laser has two inclined facets of the RIR with negative angles of inclination ψ equal to (π/4−φ/2), in FIG. 5, the laser has an external reflector in the form of a diffraction grating to one of the inclined facets;

in FIG. 6, the laser has a facet with an angle of inclination ψ equal to zero; and in FIG. 7, the laser has one inclined facet of the RIR with a positive angle of inclination and another inclined facet with a negative angle of inclination.

Figure 8:
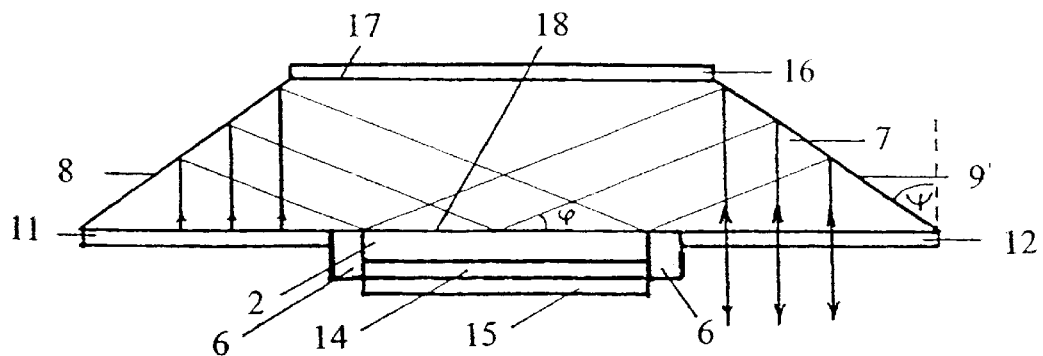
Figure 9:
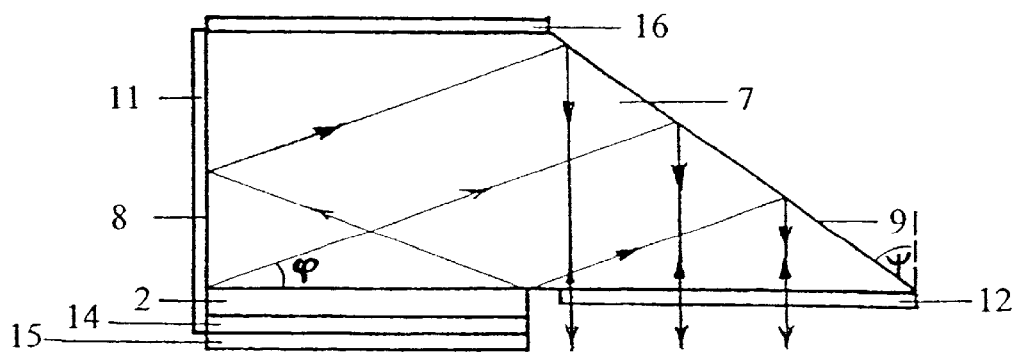

FIGS. 8–9 schematically depict longitudinal sections of designs with parts of the outer surface of the heterostructure that are implemented as reflectors of the optical resonator;

in FIG. 8, the laser has two inclined facets with angles of inclination ψ equal to (π/4+φ/2); and in FIG. 9, the laser has one inclined facet with an angle of inclination ψ equal to (π/4+φ/2), and the other with an angle of inclination ψ equal to zero.

Figure 10:
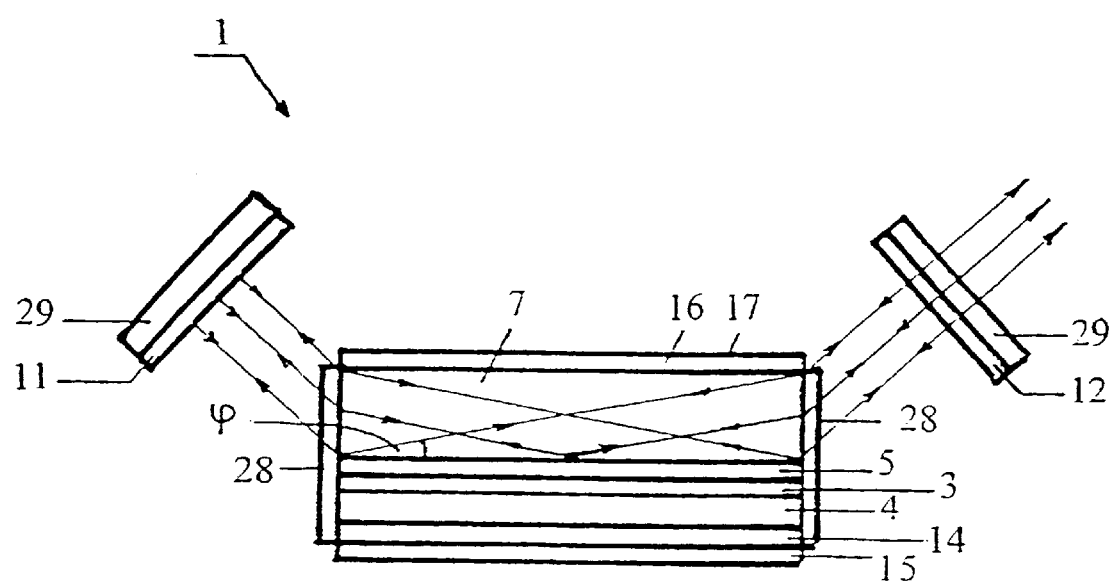

FIG. 10 schematically depicts a longitudinal section of the design of a laser with two facets with angles of inclination ψ equal to zero, and with outer inclined reflectors in the form of plane mirrors.

Figure 11:
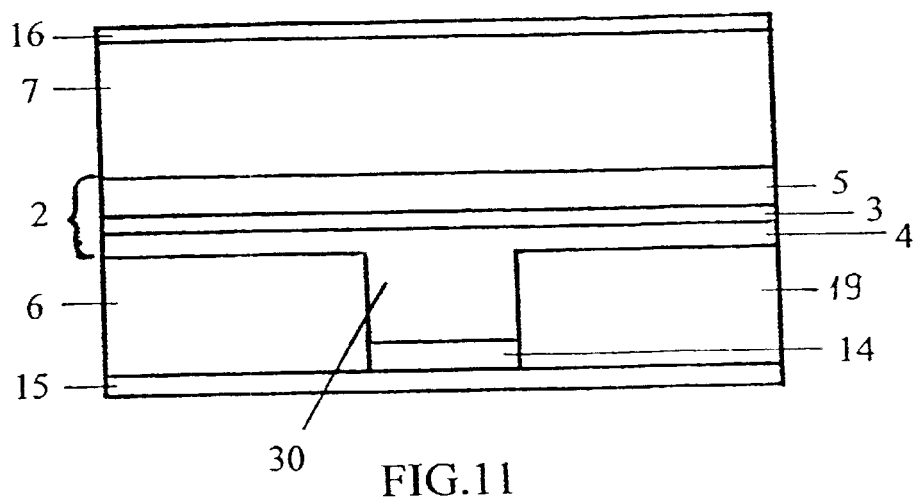
Figure 12:
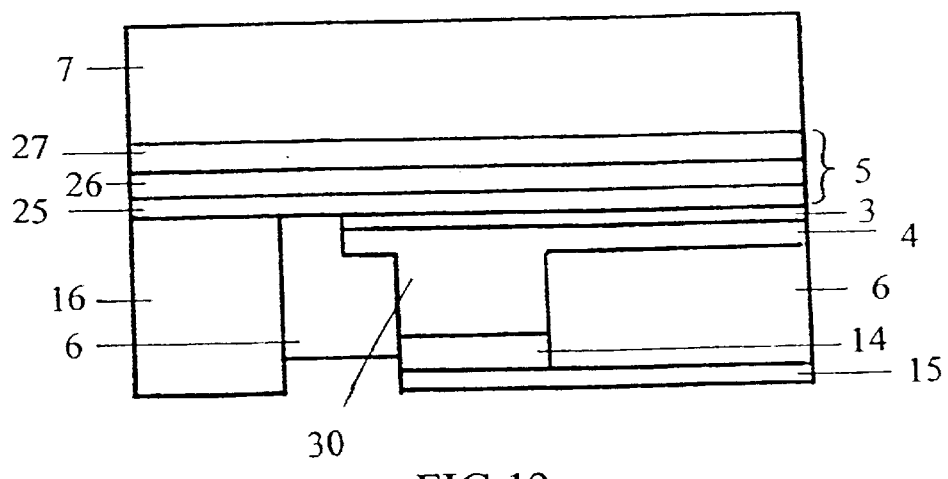
Figure 13:
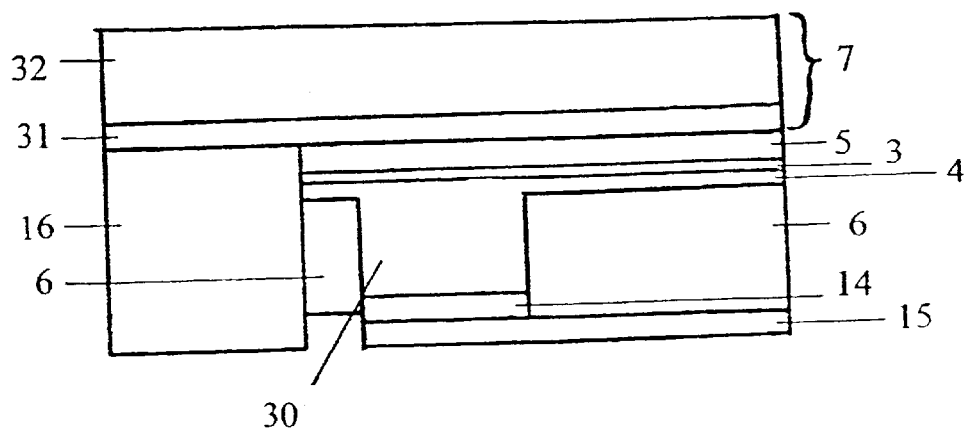

FIGS. 11–13 schematically depict cross-sections of lasers with ohmic contacts positioned differently with respect to the RIR;

in FIG. 11, the ohmic contact is on the outer surface of the RIR;

in FIG. 12, the ohmic contact is located on the electrically conductive sublayer of the cladding layer adjacent to the RIR; and in FIG. 13—the ohmic contact is on the electrically conductive part (layer) of the RIR adjacent to the heterostructure.

Figure 14:
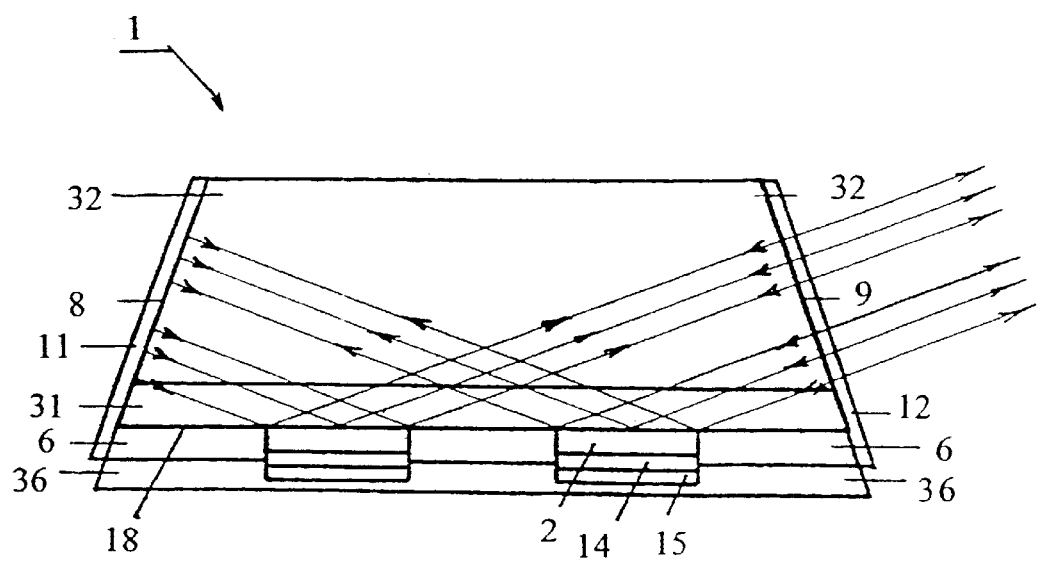
Figure 15:
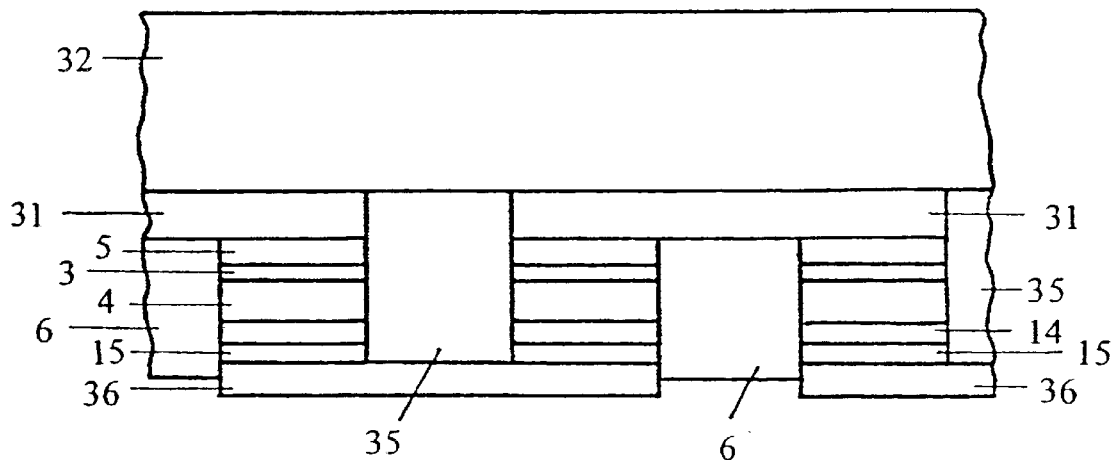

FIGS. 14–15 schematically depict a longitudinal section (FIG. 14) and perpendicular cross-section (FIG. 15) of the lasers with six GRs that are galvanically series-parallel connected and have a single common RIR.

Figure 16:
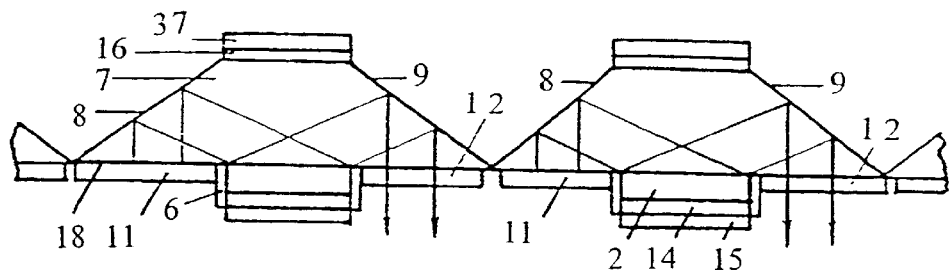
Figure 17:
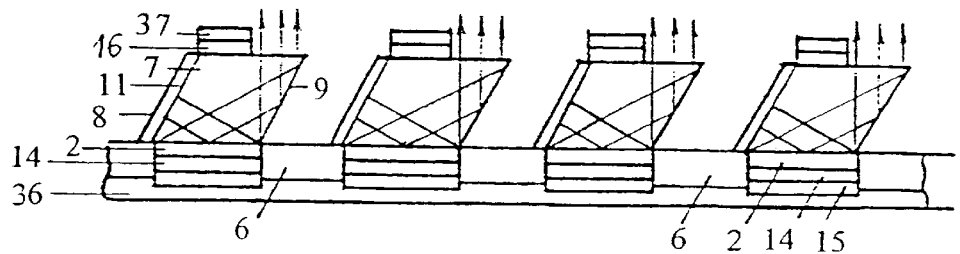
Figure 18:
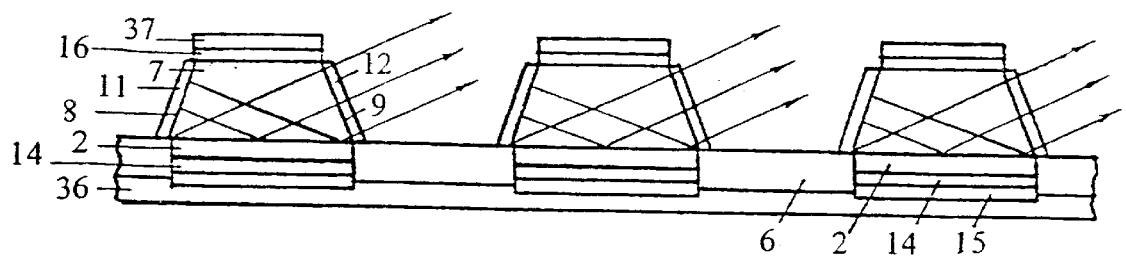
Figure 19:
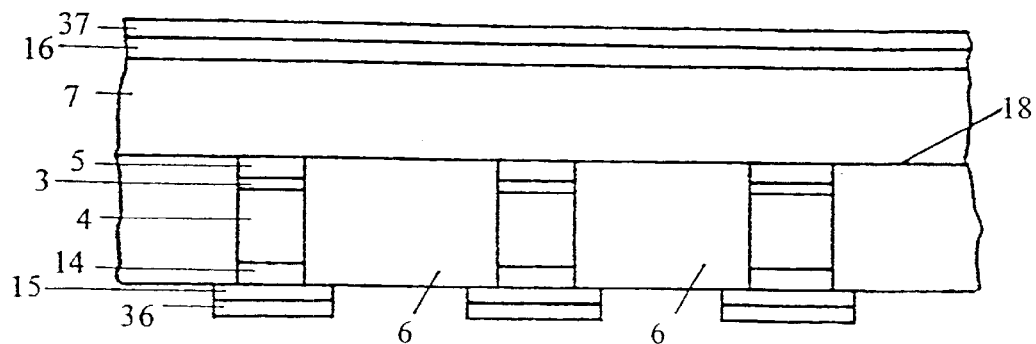

FIGS. 16–18 schematically depict longitudinal sections, and FIG. 19 depicts a perpendicular cross-section of the laser with a multiplicity of GRs independently galvanically controllable, with separate RIRs for three different sequences of GR;

in FIG. 16, each laser has two inclined facets on the RIR with positive angles of inclination (see FIG. 9) and the output of laser radiation is in the direction perpendicular to the plane of the active layer;

in FIG. 17, each laser has one inclined facet forming part of the optical resonator with a positive angle of inclination and a second inclined facet with a negative angle of inclination (see FIG. 8) and the output of laser radiation is in the direction perpendicular to the plane of the active layer; and in FIG. 18—each laser has two inclined facets on the RIR with positive angles of inclination (see FIG. 1) and the output of laser radiation is at an angle φ with respect to the plane of the active layer.

Figure 20:
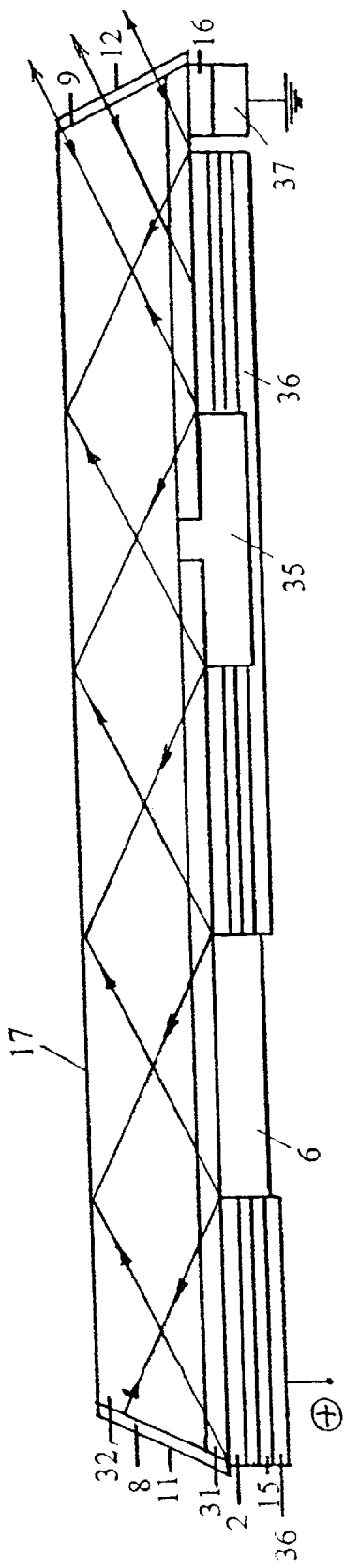
Figure 21:
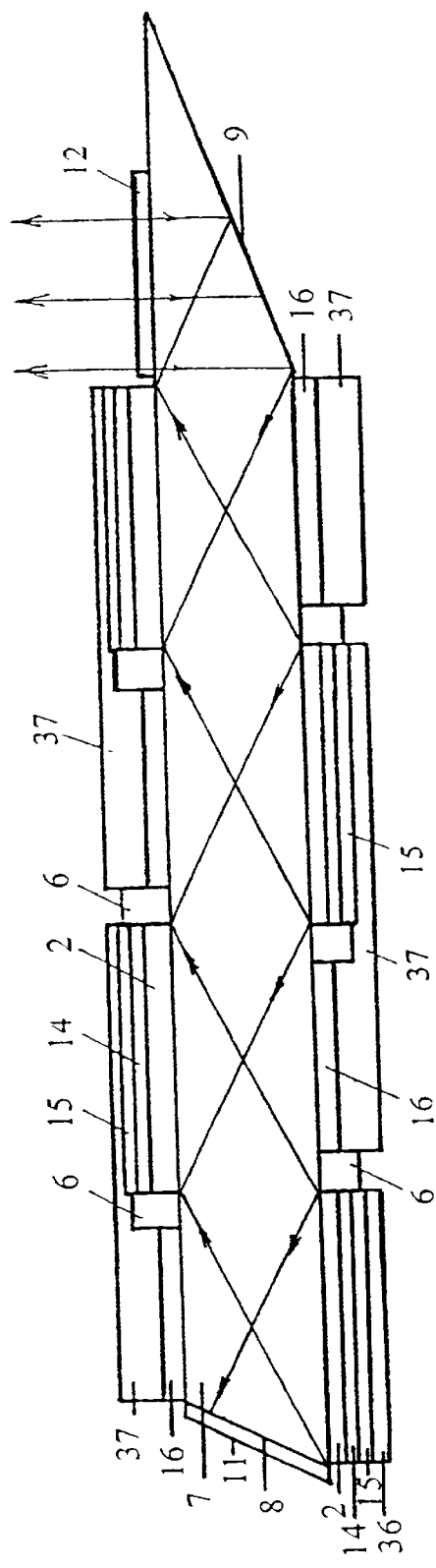

FIGS. 20–21 schematically depict longitudinal sections of the laser, with GRs that are galvanically series connected and that are disposed along their own gain axes and to a separate RIR;

in FIG. 20, the three GRs is on one surface of the RIR; and in FIG. 21, the placement of four GRs is on two opposite surfaces of the RIR.

Figure 22:
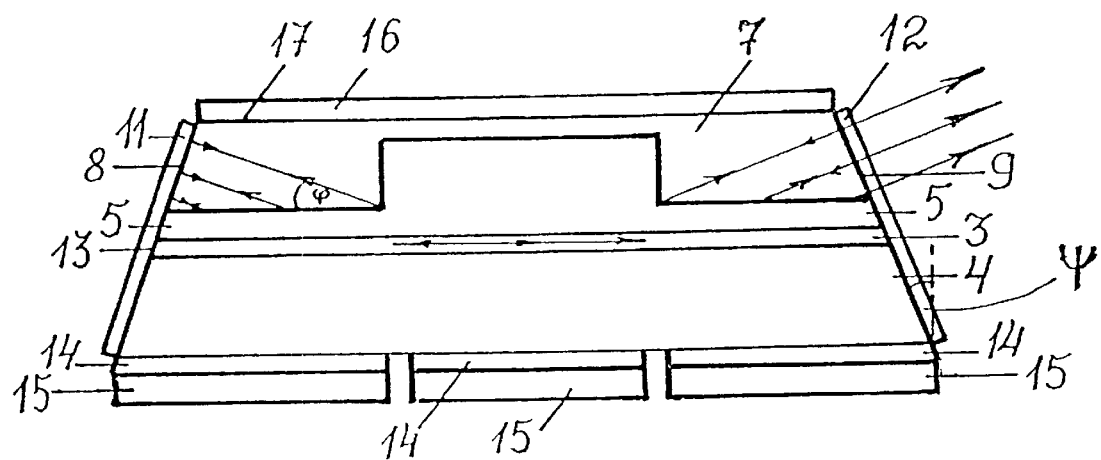

FIG. 22 schematically depicts the longitudinal section of the laser with two inclined facets and three GRs with a different thickness of the cladding layer for the middle GR and the end GRs.

Figure 23:
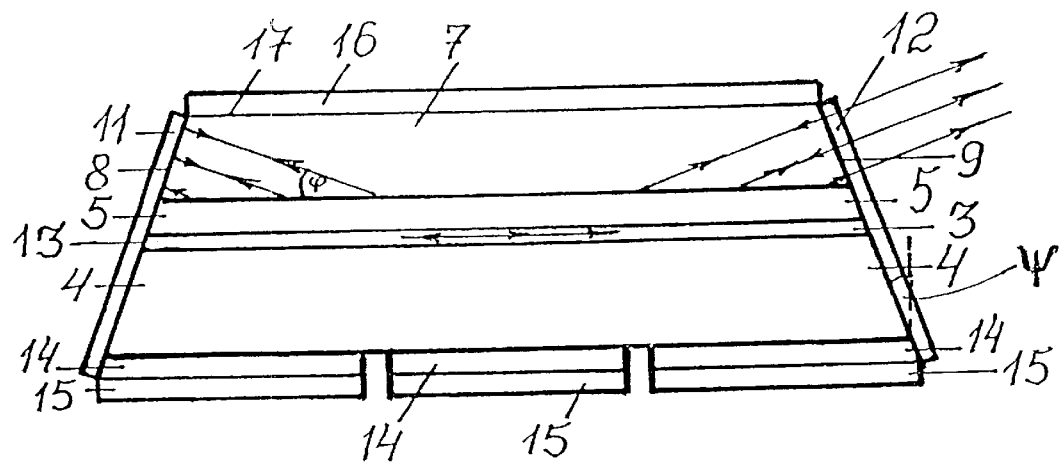

FIG. 23 schematically depicts the longitudinal section of the laser with two inclined facets and three GRs with an identical thickness of the cladding layer for the middle GR and the end GRs.

Figure 24:
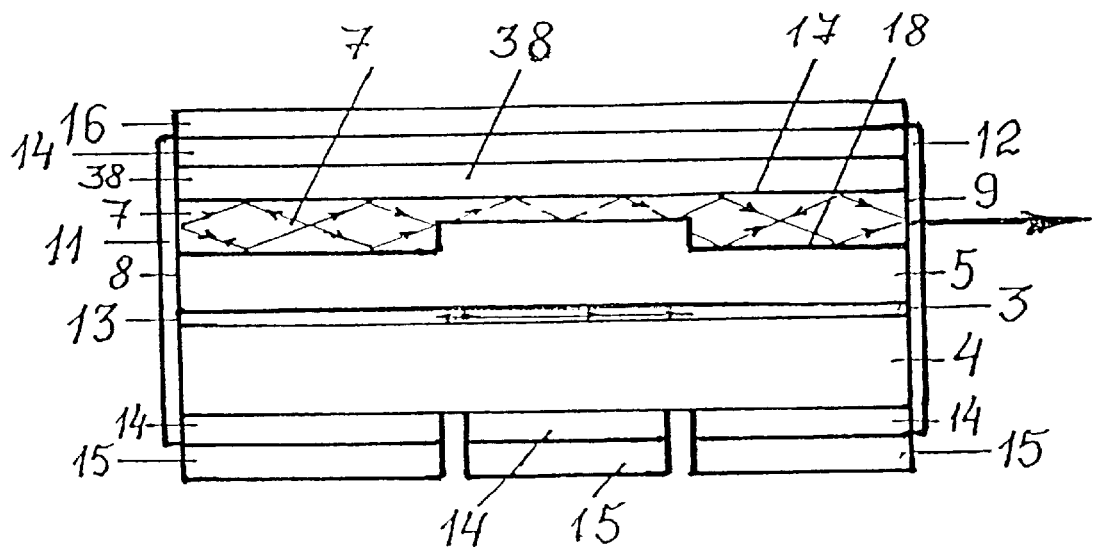

FIG. 24 schematically depicts the longitudinal section of the laser in the shape of a rectangular parallelepiped with one thin-layer RIR and three GRs and with a different thickness of the cladding layer for the middle GR and the end GRs.

Figure 25:
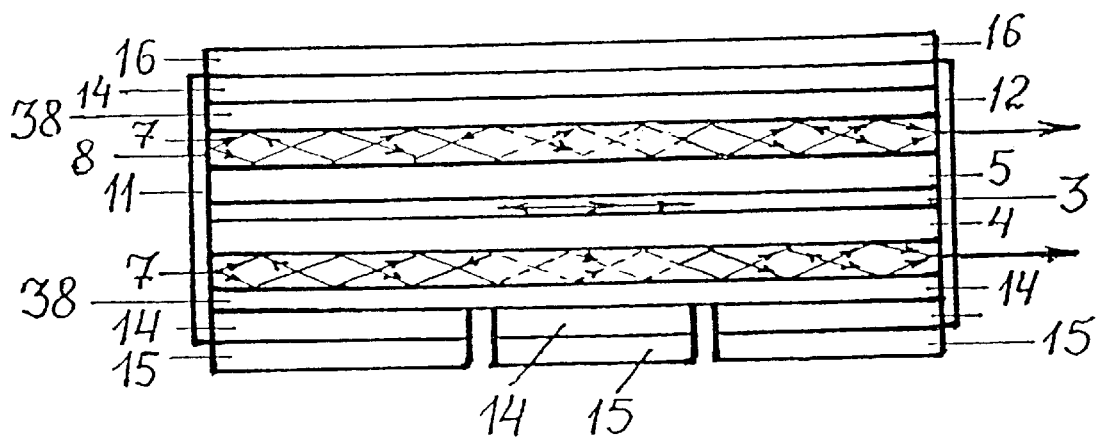

FIG. 25 schematically depicts the longitudinal section of the laser in the shape of a rectangular parallelepiped with two thin-layers RIR on both sides of the active layer and with an identical thickness of the cladding layer for the middle GR and the end GRs.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

One preferred embodiment of the invention comprises a laser with a lower current-density threshold, increased differential efficiency, reduced astigmatism and angles of divergence of the output radiation in the vertical and horizontal planes. This laser possesses enhanced spectral characteristics of the laser radiation, an expanded range of direction of laser-radiation output, and increased effective length of the optical resonator. In the aggregate, the result is increased power, efficiency, operating life, and reliability. This laser may comprise a multibeam laser. Note also that the technology for fabricating this laser is simplified.

The laser comprises an injection laser which includes a laser heterostructure that contains an active layer and cladding layers, in which it is possible to form a gain region. The laser also includes reflectors, which form an optical resonator, ohmic contacts, and on at least one side of the active layer a radiation inflow region (RIR) whose inner surface borders on the corresponding cladding layer. The condition for radiation outflow from the active layer into the radiation inflow region is fulfilled if the refractive index $n_{RIR}$ of the radiation inflow region exceeds the effective refractive index $n_{eff}$ for the aggregate consisting of the laser heterostructure and the adjoining radiation inflow region. This condition is fulfilled when $\arccos(n_{eff}/n_{RIR})$ is greater than zero. Accordingly, the composition and thicknesses of the active layer, cladding layers, and RIR are selected so that the condition for outflow of radiation from the active layer into the RIR is fulfilled, i.e., that the refractive index $n_{RIR}$ of the RIR exceeds the effective refractive index $n_{eff}$ of the heterostructure and of RIR 7 or $\phi = \arccos(n_{eff}/n_{RIR}) > 0$.

At least part of the medium of the optical resonator is made of at least part of the inflow region and of at least part of the gain region. At least one of the reflectors of the optical cavity is made with a reflection coefficient selected from the range greater than zero and less than one. Lasing occurs during operation of this injection laser which includes at least one inflow region transparent to laser radiation produced by the laser. In addition, from at least one part, the at least one gain region formed is characterized by a gain $G_{outflow}$ (cm$^{-1}$) of outflowing radiation from the active layer into the inflow region, the latter being characterized by an introduced threshold loss factor $\alpha_{RIR-thr}$ (cm$^{-1}$). The value of the gain $G_{outflow}$ (cm$^{-1}$) is selected to be greater than the factor $\alpha_{RIR-thr}$ (cm$^{-1}$). The condition for radiation outflow from the active layer into the radiation inflow region is defined by the relations:

$$\arccos(n_{eff}/n_{RIR}) \leq \arccos(n_{eff-min}/n_{RIR}),$$

where $n_{eff-min}$ is greater than $n_{min}$, and where $n_{eff-min}$ is the minimum value of $n_{eff}$ out of all possible $n_{eff}$ for the multiplicity of laser heterostructures with radiation inflow regions that are of practical value. The index $n_{min}$ is the smallest of the refractive indices in the heterostructure cladding layers.

The laser is unique in its choice of the medium for the optical resonator, which includes at least part of the RIR and at least part of the GR. Optical feedback is assured by the fact that at least one of the reflectors in the optical resonator, which is disposed, for example, on one of the facets of the RIR, is made with a reflection coefficient selected from the range greater than zero and less than one. The choice of the compositions, thicknesses, and number of layers and sublayers of the heterostructure and RIR in the working laser assures outflow of directional spontaneous radiation or emission from the active layer (or GR) into the RIR with an intensity sufficient to fulfill the condition for lasing in the optical resonator. For any laser as well as this particular embodiment, a condition for lasing is that the radiation gain exceed the losses. This condition for operating the injection laser will be realized, in terms introduced above, when the value of the gain $G_{outflow}$ (cm$^{-1}$) of the outflowing radiation from the active layer into the RIR exceeds the value of the threshold loss factor $\alpha_{RIR-thr}$ (cm$^{-1}$); this threshold loss factor $\alpha_{RIR-thr}$ characterizes the radiation inflow region and moreover all radiation losses in the optical resonator at the lasing threshold. The lasing-threshold condition obtained may be written as:

$$G_{outflow-thr} = \alpha_{RIR-thr} = (\mu \cdot \alpha_{RIR}) + \alpha_{out} + \alpha_{diffr}, \quad (3)$$

where $G_{outflow-thr}$ (cm$^{-1}$) is the value of the gain $G_{outflow}$ at the lasing threshold, $\alpha_{RIR}$ is the optical loss factor of the laser radiation in the RIR (which includes, e.g., absorption, scattering), $\alpha_{out}$ is the net loss factor, which is related to the laser radiation output from the optical resonator and which is equal to:

$$\alpha_{out} = (2L_{GR})^{-1} \cdot \ln(R_1 \cdot R_2)^{-1}, \quad (4)$$

$\alpha_{diffr}$ is the coefficient of diffraction losses of laser radiation as it exits from the optical resonator. More specifically:

$$\alpha_{diffr} = (L_{OR})^{-1} \cdot \ln\{1 - (\lambda \cdot L_{OR}/n_{RIR} \cdot S_{refl})\}^{-1}, \quad (5)$$

$S_{refl}$ is the area of the reflectors of the optical cavity, $L_{OR}$ is the length of the optical resonator, which is equal to $(\mu \cdot L_{GR})$ (see equation (1)), and $R_1$ and $R_2$ are the coefficients of reflection for the reflectors of the optical resonator.

Depending on the laser, the ratio $\mu$, equation (1), may range from approximately 0.8 to 3.0. The current density through the laser at which equation (3) is fulfilled is the threshold current density $j_{thr}$.

Note that the lasing preferably does not occur in the GR, which, in both the laser disclosed in U.S. Pat. No. 4,063,189, issued to D. F. Scifres et al. in 1977, as well as in other known lasers, corresponds to the medium of the optical resonator. This objective is easily accomplished by selecting the mode of intensive outflow, in which the value of $G_{outflow}$ (cm$^{-1}$) is selected to be close to the value of the total gain $G_{GR}$ (cm$^{-1}$) of the radiation propagating in the GR. Or more accurately, the following condition is fulfilled: the difference between the gains ($G_{GR} - G_{outflow}$) is smaller than the total loss factor $\alpha_{GR-thr}$ (cm$^{-1}$) of the radiation propagating in the GR. Moreover, the intensive outflow mode is preferable for the lasers, since it results in increased efficiency. In addition to the mode of intense outflow of radiation from the GR, the laser is also characterized as producing an outflowing radiation mode having a wide range of outflow angles $\phi$ (see equation (2)), and accordingly of the ratios ($n_{eff}/n_{RIR}$). Preferably, the upper bound of the outflow angles $\phi_{max}$ is defined by the relations:

$$\arccos(n_{eff}/n_{RIR}) \leq \arccos(n_{eff-min}/n_{RIR}) = \phi_{max}, \quad (6)$$

$$\text{for } n_{eff-min} > n_{min}, \quad (7)$$

where $n_{eff-min}$ is the minimum value of $n_{eff}$ out of all possible $n_{eff}$ for the multiplicity of heterostructures with inflow regions that are of practical value, and $n_{min}$ is the smallest of the refractive indices in the heterostructure cladding layers. Using numerical calculations for a heterostructure based on InGaAs/GaAs/AlGaAs compounds with a RIR of GaAs, which emits at wavelengths of between about 0.92–1.16 µm, the maximum outflow angle $\phi_{max}$ was found to be approximately 30°.

The laser with the aforementioned features is unique in that it uses spontaneous radiation directed at an angle to the longitudinal gain axis in the GR, followed by amplification thereof and lasing in the optical resonator. The path of the laser rays in such a resonator experiences a "bending" ("refraction"), with simultaneous amplification of the radiation. The angle $\phi$ of radiation outflow from the gain region in the RIR is made equal to the radiation inflow angle $\xi$ for laser (and spontaneous) rays that are reflected from the reflectors of the optical resonator and that are directed from the RIR back into the GR. The aforementioned feature of optical-ray propagation is preferably used for all designs of the laser, based on the known optical principle of the reversibility of the ray path in optical systems, which is applied to the multilayer laser heterostructure in aggregate with a RIR.

The aggregate of the characteristic features determines the uniqueness of the operation and the advantages of the lasers. Lasing and the process of generation of the corresponding modes in their optical resonator occur mostly as the laser rays propagate in the homogeneous, weakly absorbing volume of the RIR. Only after the laser rays reflected from the facets of the RIR are incident on the heterostructure (which generally is asymmetrical) does local amplification and total internal reflection occur. In conventional lasers the corresponding modes of laser radiation are formed in a fundamentally different way, namely lasing occurs entirely in the thin active dielectric waveguide of a GR bounded by the end reflectors of the optical resonator, while amplification occurs along the entire propagation path in the GR. In view of the foregoing, the laser may be called an "injection laser (or diode laser) with a resonant cavity."

The aforementioned distinctions determine the basic advantages of the lasers. In comparison with conventional lasers, for example, the threshold current density $j_{thr}$ can be reduced. This feature is due to the fact that if there are equal net losses to radiation output, defined by the factor $\alpha_{out}$ (see equation (4)), the optical losses in the volume of a homogeneous RIR which are characterized by the coefficient $\mu \cdot \alpha_{RIR}$ (cm$_{-1}$), can be made smaller than the internal optical losses in a multilayer gain region (the factor $\alpha_{GR}$). This is possible, at least in part, because the composition of the RIR may be selected to differ from the composition of the semiconductor layers of the heterostructure. In addition, by selecting the Fresnel number N (which is equal to $\lambda \cdot L_{OR}/n_{RIR} \cdot S_{refl}$) to be much larger than one, the known diffraction losses can be made negligibly small (see equation (5)). Also see A. Meitland and M. Dann, *Introduction to Laser Physics* [in Russian], Nauka Publishers, 1978, pp. 102–118.

There are additional possibilities for reducing the threshold current density in the lasers. This threshold current density is reduced not only in comparison with the threshold currents of a laser with a small outflow angle $\phi$ (see U.S. Pat. No. 4,063,189, issued to D. R. Scifres et al. in 1977) but also in comparison with the threshold currents of modern lasers with quantum-dimensional active layers, as for example discussed in S. S. Ou et al. (*Electronics Letters* (1992), Vol. 28, No. 25, pp. 2345–2346). One possibility is related to the selection of larger outflow angles $\phi$ (from the range $0<\phi<\phi_{max}$), which is determined by relations (2), (6), and (7) and results in an increase in the optical radiation localization coefficient $\Gamma$, which in turn inevitably leads to an additional decrease in the threshold current densities (see, e.g., T. M. CoCKerill et al., *Appl. Phys. Lett.* (1991), Vol. 59, pp. 2694–2696).

The differential efficiency also can be increased with these lasers. The following estimating formula has been obtained to characterized this differential efficiency:

$$\eta_d = \eta_1 \cdot \eta_2. \tag{8}$$

Here, the coefficient $\eta_1$ corresponds to the efficiency of output of the outgoing radiation from the GR into the RIR, and is equal to $$\eta_1 = G_{outflow}/(G_{outflow} + \alpha_{GR}). \tag{9}$$

In contrast, $\eta_2$ corresponds to the efficiency of output of the laser radiation from the RIR, and is equal to $$\eta_2 = \alpha_{out}/(\alpha_{out} + (\mu \cdot \alpha_{RIR}) + \alpha_{diff}). \tag{10}$$

The factor $\alpha_{GR}$ includes of the optical radiation losses in the GR (the factor $\alpha_{GRF}$) and the losses to radiation output at the start and end of the GR (the factor $\alpha_{GRO}$). Specifically, $\alpha_{GR}$ is defined by the equation:

$$\alpha_{GR} = \alpha_{GRO} + \alpha_{GRF}. \tag{11}$$

By selecting a gain $G_{outflow}$ significantly greater than $\alpha_{GR}$, we will obtain an efficiency $\eta_1$ (see equation (9)) close to one. Note that in U.S. Pat. No. 4,063,189, issued to D. R. Scifres et al. in 1977, the increase in the gain $G_{outflow}$ is constrained by the increase in the lasing threshold current. For the lasers designed as described above, however, this constraint does not exist. If $\alpha_{out}$ is selected to be much larger from the sum $(\mu \cdot \alpha_{RIR}) + \alpha_{diff}$, the efficiency $\eta_2$ can be made close to one (see equation (10)). The efficiency $\eta$ is defined, herein, as the total efficiency of the laser without regard for losses due to electrical resistance, for which the following equation obtains:

$$\eta = \eta_d \cdot \eta_{thr}, \tag{12}$$

where $$\eta_{thr}(1 - j_{thr}/j_{oper}), \tag{13}$$

and $j_{oper}$ is the operating current density through the laser. It follows from relations (12) and (13) that simultaneously increasing $\eta_1$ and $\eta_2$ (equation (8)) and decreasing $j_{thr}$ will lead to an increase in the efficiency $\eta$.

The spatial and spectral characteristics of the laser radiation can also be improved in these laser devices. In the original design of the optical resonator, the mode of the laser radiation is basically generated in the homogeneous volume of the RIR (or of homogeneous parts thereof) in the absence of nonequilibrium majority carriers. In ordinary lasers, the concentration of injected carriers and the optical gain affect the value of the refractive index of the directional waveguide modes of the radiation. This attribute significantly determines the stability or lack thereof of the spatial and spectral characteristics of injection lasers (M. Osinski et al., *IEEE Journ. of Quant. Electronics,* Vol. 23, 1987, pp. 9–29). In the lasers described above, however, the aforementioned gain and injection processes are distributed, and they occur only on a very small part of the total optical path length. Therefore, the lasing mode of one spatial mode with respect to the transverse index in the direction parallel to the layers of the laser heterostructure (with a corresponding decrease in the angle of divergence $\Theta_2$ in the horizontal plane) can be preserved for significantly larger dimensions of the strip than in ordinary lasers. Consequently, the divergence of the output radiation will be significantly reduced in not only the vertical but also the horizontal plane. As defined herein, the horizontal plane corresponds to the plane that is perpendicular to the vertical plane and that is located on the output surfaces. In the general case, the output surfaces are defined as the laser surface for radiation output.

Furthermore, stable generation of single-frequency laser radiation can be achieved in these lasers over a wider range of currents. Moreover, the so-called "chirp effect," the frequency shift of the laser radiation resulting from changes in the pumping-current amplitude (see, e.g., T. L. Koch and J. E. Bowers, *Electronics Letters*, Vol. 20, 1984, pp. 1038–1039), which is undesirable for a number of applications, can also be reduced significantly.

Note also that the lasers described above have a feature that significantly simplifies the technology for making them in comparison with conventional laser designs. For example, to eliminate undesirable losses in the lasers disclosed in U.S. Pat. No. 4,063,189 issued to D. R. Scifres et al. in 1977, one reflector of the optical resonator must be made with a reflective coating, and the optical facet of the RIR that is an extension thereof must be made, by contrast, with an anti-reflective coating. This design is difficult to fabricate in view of the micron dimensions of the reflector. Since the intensive outflow mode ($G_{outflow} \cong G_{GR}$) is implemented for the lasers and since laser radiation is not generated in the GR, it is possible to simplify the technology for fabricating the lasers without significantly effecting the output characteristics. This goal can be achieved by making the angles of inclination $\psi$ and the reflection coefficients of the faces of the RIR and adjacent end surfaces the same.

Also in the lasers described above, the active layer is preferably formed of at least one sublayer, and the active layer can be implemented as one or several active sublayers, including sublayers having quantum-dimensional thicknesses separated from each other by barrier sublayers. The cladding layers, which are respectively positioned on the first surface and opposite second surface of the active layer, are respectively formed from cladding sublayers $I_i$ and $II_j$, where $i=1, 2, \ldots, k$ and $j=1, 2, \ldots, m$ are defined as integers that designate the sequential number of the cladding sublayers, counted from the active layer, with refractive indices $n_{Ii}$ and $n_{IIj}$, respectively, and with bandgaps $E_{Ii}$ and $E_{IIj}$. At least one cladding sublayer is made in each cladding layer. If the active layer comprises sublayers, the cladding layers generally are made of two or more sublayers on each side of the active layer. For the case where the active layer comprises one sublayer with a thickness of approximately 50 nm or more, each cladding layer comprise one sublayer. We consider the gradient layers used (see, e.g., S. S. Ou et al., Electronics Letters (1992), Vol. 2F, No. 25, pp. 2345–2346) to be the final number of sublayers of a cladding layer with corresponding $n_{Ii}$ and $n_{IIj}$ obtained by layering each sublayer in the gradient layer. Here, in general the refractive indices of the cladding layers usually are smaller than the refractive indices of the active sublayers. By selecting the aforementioned versions of the active and cladding layers (for the specified heterostructure) it also is possible to effect improvement of the efficiency and threshold current density, and to ensure the necessary value of $n_{eff}$ used in equations (2), (6), and (7).

In preferred embodiments, at least one of the angles of inclination $\psi$ of the facets of the RIR is greater than zero in absolute value as defined with respect to the plane perpendicular to the longitudinal gain axis called the normal plane. The angle of inclination $\psi$ is arbitrarily designated positive if the facet subtends an acute angle with the inner surface (or with the active layer, since the output surface and the active layer are parallel to each other), and to be negative if the facet subtends an obtuse angle with the inner surface. The inclined facets introduced into the design and which have specified angles of inclination $\psi$ make it possible, by using easy to implement technological solutions, to obtain an efficient design of an optical resonator with feedback, that provides for different directions of laser radiation output, as well. For some laser designs, barrier regions are introduced into the heterostructure. The introduction of barrier regions makes it possible to create lasers with a strip gain region (i.e., in the form of a strip of width $W_{GR}$) that incur small losses of injection current to spreading. Barrier regions also enable multibeam lasers to be formed.

To eliminate current losses, the length $L_{RIR}$ of the inner surface of the RIR, which is determined along the longitudinal gain axis of the GR, and the width $W_{RIR}$ of the RIR, are made to be at least of length $L_{GR}$ and at least of width $W_{GR}$ of the GR, respectively. The thickness $d_{RIR}$ of the RIR depends on the outflow angle $\phi$, the length $L_{GR}$, and the angles of inclination of the optical facets. This thickness may be varied over a wide range from about 2 $\mu$m to about 50,000 $\mu$m or more.

Since the RIR actually is the passive volume of the optical resonator, transparency of the RIR is necessary for the functioning of the laser. To obtain higher efficiency of the laser, the RIR (or a part thereof) must be made of an optically homogeneous material, and the optical radiation losses in it (to absorption and scattering) must be much smaller than the net losses to laser radiation output from the optical resonator. Specifically, the condition $\alpha_{RIR} \ll \alpha_{out}$ must be fulfilled, or $$\alpha_{RIR} \ll (2 \cdot L_{GR})^{-1} \cdot \ln(R_1 \cdot R_2)^{-1}. \tag{14}$$

If the RIR is made of a semiconductor material, in addition to the requirements of homogeneity, to fulfill equation (14) the RIR must have a bandgap $E_{RIR}$ larger than the bandgap $E_a$ for the active layer, which determines the wavelength $\lambda$ of the laser radiation. Losses to absorption are known to decrease approximately exponentially, depending on the difference between $E_{RIR}$ and $E_a$ (see, e.g., H. C. Huang et al., *Journ. Appl. Phys.* (1990), Vol. 67, No. 3, pp. 1497–1503). To reduce the optical loss factor $\alpha_{RIR}$ (cm$^{-1}$) and consequently to attain, in addition to high differential efficiency $\eta_d$ and low $j_{thr}$, an increase in output radiation power (as a result of an increase in the effective length of the optical resonator), it is desirable for $E_{RIR}$ to exceed $E_a$ by at least about 0.09 eV. In this case the optical loss factor for absorption may reach values on the order of about 0.1 cm$^{-1}$ or less. In the general case, the RIR may be made not only of semiconductor materials. It is preferred that its characteristics, particularly the refractive index $n_{RIR}$ and optical loss factor $\alpha_{RIR}$ for absorption and scattering, satisfy the relations in equations (2), (6), (7), and (14).

To simplify the technology for making the laser, the RIR may comprise a substrate on which a heterostructure is grown. Furthermore, the RIR may be made electrically conductive, and in this case, an ohmic contact is formed with the surface of the RIR.

In cases where the RIR is nonconductive, in order to obtain low values of $\alpha_{RIR}$ (cm$^{-1}$) and increase the effective length $L_{OR}$ of the optical resonator and the output radiation power P(W), part of the volume of the RIR that borders on the heterostructure is preferably made electrically conductive, and the remaining volume preferably comprises a material with an optical loss factor $\alpha_{RIR}$ of no more than about 0.1 cm$^{-1}$. This part of the RIR that borders the heterostructure preferably has of a thickness no greater than $W_{GR}$ ($\mu$m).

Hereinafter, this part of the volume of the RIR that borders on the heterostructure and that has the specified thickness is referred to as the first layer of the RIR. The other parts of the RIR may be the second layer of the RIR, which is adjacent to the first, third, and subsequent layers. Preferably, the parts of the RIR that are layers parallel to its inner surface comprise materials with different refractive indices. In such cases, when the difference in the properties of the aforementioned layers of the RIR includes not only electrical conductivity but also different refractive indices, the outflow angles $\phi$ (2) in the layers of the RIR can be controlled. Hence the thickness of the RIR and its layers also can be controlled. The outflow angle $\phi_i$ in the i-th layer (where i=2, 3, . . . , s are integers) with a refractive index $n_{RIRi}$ is equal to $\arccos(n_{eff}/n_{RIRi})$ (see equation (2)). Therefore, if for example the refractive index $N_{RIR1}$ of the first layer is smaller than $n_{RIR2}$ for the second layer, the thickness of the second layer may be made smaller than for the first layer, and vice versa. Decreasing the thickness $d_{RIR}$ may lead to simplification of the technology and to a lowering of the costs of making the RIR. In both cases, an ohmic contact is made with the electrically conductive part of the RIR, and the thickness of this part of the RIR is preferably no greater than the width $W_{GR}$ of the GR.

In lasers whose RIR has an optical loss factor $\alpha_{RIR}$ of no more than about 0.1 cm$^{-1}$, it is possible to achieve a large volume of the active GR (by increasing $L_{GR}$ to approximately 1 cm) with small laser-radiation losses in the RIR, and to obtain large values of the output radiation power. In lasers having a width $W_{GR}$ of micron dimensions, to simplify the fabrication, an ohmic contact from the direction of the RIR is made with one of the electrically conductive cladding sublayers that is located between the active layer and the RIR, preferably with the electrically conductive sublayer that has the smallest bandgap.

For those laser designs in which, for large values of $L_{GR}$, it is undesirable to have a large thickness $d_{RIR}$ ($\mu$m), preferably at least one of the cladding sublayers has a refractive index no smaller than $n_{RIR}$. This leads to an increase in the value of $n_{eff}$ and consequently to a decrease in the outflow angle $\phi$ (see equation (2)) and in $d_{RIR}$. Small thicknesses $d_{RIR}$ lead to savings of material in the RIR.

To simplify the technology for fabricating the lasers, preferably the end surface of the GR, on at least one side has the same angle of inclination $\psi$ and the same reflection coefficient as the adjacent optical facet of the RIR. As noted previously, in practice, this feature will not degrade the performance of the laser.

Different embodiments of the injection laser are described below.

In one laser, for example, preferably at least one optical facet of the RIR comprises a reflector of the optical resonator and has a positive angle of inclination $\psi$ equal to the outflow angle $\phi$, which is equal to $\arccos(n_{eff}/n_{RIR})$. This configuration provides the ability to make the lasers with an outflow angle $\phi$ throughout the entire range of its values, as defined in equations (2), (6), and (7), up to $\phi_{max}$. Within this range is included values of the angles $\phi$ larger than the angle of total internal reflection $\sigma$. Hence, one can reduce the threshold current density, increase the efficiency and power, decrease the angle of divergence in the vertical plane, and effect output of laser radiation through the optical facet of the RIR when the radiation is normally incident on the optical facet.

For the same purposes, but with implementation of laser radiation output perpendicular to the plane of the active layer, at least one optical facet is formed with a negative angle of inclination $\psi$ equal to $(\pi/4)-(\phi/2)$, and at least part of the outer surface of the RIR comprises a reflector of the optical resonator. This part of the outer surface of the RIR preferably corresponds at least to the portion where the projection of the optical facet is formed on the RIR. Alternatively, at least one optical facet of the RIR is formed with a positive angle of inclination $\psi$ equal to $(\pi/4)+(\phi/2)$, and at least part of the laser surface opposite the RIR comprises a reflector of the optical resonator. This part of the laser surface opposite to the RIR preferably corresponds at least to the portion where the projection of the optical facet is formed thereon. In the first case, radiation output will occur through the outer surface of the RIR, and in the second case it will occur in the diametrically opposite direction.

In a number of other cases, in the aforementioned laser designs the other optical facet of the RIR is formed with an angle of inclination $\psi$ of about zero. A reflective coating is formed on the other optical facet of the RIR (when the angle $\phi$ is less than the angle of total internal reflection $\sigma$ on the output surface). This leads to one-way output of laser radiation, and also to a decrease in the length $L_{GR}$ and in the angle of divergence $\Theta_1$ of the output laser radiation in the vertical plane.

To enhance the spatial and spectral characteristics of the laser, preferably, at least one of the reflectors of the optical resonator comprises an external reflector. If the angle $\phi$ is smaller than the angle $\sigma$, the use of an external reflector (outside the RIR) makes it possible to create a laser in which both facets of the RIR subtend an angle of inclination $\psi$ equal to about zero. This simplifies the technology for fabricating the laser, since there is no need to make the facets for the RIR sloped. In this case, feedback is generated by using an external reflector (or reflectors) made with the corresponding angle of inclination.

It is also possible that one of the reflectors of the optical cavity, which is formed either as an external reflector, or on the output surfaces of the RIR or heterostructure, comprises a plane mirror, a cylindrical mirror, a spherical mirror, or a diffraction grating.

Note that it is accepted practice, see, e.g., I. I. Bronshtein and K. A. Semendyayev, *Handbook of Mathematics* (in Russian), p. 170, 1953 to measure the angles of inclination $\psi$ formed between two half-planes (a facet and the inner surface) as the angle between two perpendiculars drawn in both half-planes from one point on the line of their intersection. The accuracy with which the angle of inclination $\psi$ is preferably made is determined by the dispersion angle of divergence $\Delta\phi$. The diffraction angle of divergence may be ignored because of its smallness in comparison with the angle $\Delta\phi$. The dispersion angle is determined instead by the spread of the outflow angle $\phi$ as a function of the wavelength $\lambda$, which varies over the range of the spectral band $\Delta\lambda$ for spontaneous radiation. The angle $\Delta\phi$ has been determined by a numerical calculation using equation (2) for the known dependences of $n_{eff}$ and $n_{RIR}$ on $\lambda$ in the range $\Delta\lambda$. The calculations show that for the most frequently used heterostructures with $\Delta\lambda$ of about 20–50 nm, the angle $\Delta\phi$ lies in the range from about 0.5° to about 1.5°.

Preferred embodiments of the lasers include designs with two or more, i.e., plurality of gain regions.

A unique feature of one multibeam laser is that at least two gain regions are formed on the inner surface of at least one RIR preferably so as to produce identical outflow angles $\phi$. The gain regions, which may (but not necessarily) have a rectangular shape, are positioned with specified periods, including those in a mutually perpendicular direction. In a number of cases, an independent ohmic contact is made with each GR from the direction opposite the location of the RIR. Such a laser using an output reflector of the RIR will have a multiplicity of laser beams, including beams that are spatially separated from each other and that can be turned on independently by the operating current.

In another multibeam laser, a multiplicity of laser beams form a two-dimensional matrix in which each beam is independently controllable by the operating current. The gain regions are formed from at least two sequences of GRs. In each at least two GRs are disposed so that the gain axes of each GR in each sequence are parallel to each other. These gain axes are positioned at a right angle to the line of intersection of the active layer with the extension of the plane of the facet of the common RIR for each sequence of GRs. Furthermore, from the direction of the RIR, on at least part of the outer surfaces of the common RIRs, ohmic contacts and metallization layers electrically connected to them are formed. At least the metallization layers are formed in strips, one for each sequence of GRs. From the direction opposite the location of the RIR, the metallization layers connected to the independent ohmic contacts are formed in strips that are insulated from each other and are positioned parallel to the gain axes of the GRs.

In another laser, several GRs are successively connected to a unified optical resonator. In this case, the GRs are formed along at least one line parallel to the longitudinal gain axes of the GRs. The spacing between the starts of the GRs is $2d_{RIR}/\tan \phi$, and the outer surface is optically reflective, at least at points on the projection of the gain regions onto the outer surface at the outflow angle $\phi$. It also is possible to form at least one GR having identical outflow angles $\phi$, on opposite surfaces, of RIRs along two lines that are parallel to each other and to the longitudinal gain axes of the GRs; here, the shortest distance between the starts of the GR on opposite sides of the RIR is selected to be $d_{RIR}/\sin \phi$. These modifications make it possible to increase the radiation output power while at the same time reducing the thickness of the RIR and improving the conditions of heat removal.

In lasers with either one or a multiplicity of gain regions, the gain region or at least two adjacent GRs be galvanically isolated all the way to the nonconductive part of the volume of the RIR, and that the ohmic contacts of the gain regions be galvanically coupled by a metallization layer. This arrangement makes it possible to increase the value of the supply voltage and to perform effective matching of the lasers to power sources.

The laser described above includes an original design of an optical resonator the volume (bulk) of whose medium comprises not only an active layer but also the volume of the gain region with intense outgoing radiation, as well as the passive volume of the radiation inflow region, which are formed with appropriately made compositions and thicknesses. These features along with the number of layers of the laser heterostructure, the configuration of the radiation inflow region and its optical facets, the ohmic contacts, and the metallization layers, make possible practical delimitation of the region of generation of laser-radiation modes and the region of injection and stimulated recombination of non-equilibrium carriers.

This unique laser design offers many advantages. These include a decrease in the threshold current density, an increase in efficiency (including differential efficiency), and an improvement in the level of astigmatism. This laser produces small angles of divergence close to the diffraction angles for two mutually perpendicular directions of output radiation, and provides an increase in the stability of mono-mode lasing, a significant decrease in the dependence of the wavelength of the generated laser radiation on the pumping-current amplitude, and the ability to increase the effective length of the optical resonator and radiation output power. Many of these advantages accrue from the unique design of the laser and, in particular, by rejecting the traditional dielectric waveguide design with an active layer inside, as a lasing medium for generating directional waveguide modes. Additional advantages of the laser include the ability to obtain different directions of laser radiation, including those perpendicular to the plane of the active layer, as well as increased service life or lifetime and operational reliability. These lasers are also highly manufacturable. An additional advantage of the laser with a multiplicity of gain regions is that the integrated technology can be employed for fabricating these devices.

The technical implementation of the invention is based on known basic production processes, which by now are well developed and are used extensively in laser manufacture. The range of radiation wavelengths of the lasers that have been put to use to date extends from the infrared to the ultraviolet. Depending on the wavelength, appropriate heterostructures are used for different sections of the wavelength range. For example, heterostructures based on semiconductor compounds in the AlGaN/GaN/GaInN system, and also in the ZnCdSSe/GaAs system, are most effective for ultraviolet, blue, and green radiation ($0.36~\mu m<\lambda<0.58~\mu m$); compounds in the AlGaInP/GaAs system are most effective for red and yellow ($0.58~\mu m<\lambda<0.69~\mu m$); compounds in the AlGaAs/GaAs system and in the InGaAs/GaAs/AlGaAs system are most effective for infrared ($0.77~\mu m<\lambda<1.2~\mu m$); compounds in the GaInAsP/InP system are most effective for infrared ($1.2~\mu m<\lambda<2.0~\mu m$); and compounds in the AlGaInSbAs/GaAs system are most effective for infrared ($2.0~\mu m<\lambda<4.0~\mu m$). In each of the aforementioned ranges, appropriate materials for the RIR that satisfy conditions (2), (6), (7), and (14) must be selected, depending on the wavelength $\lambda$ used and the heterostructure chosen. Among semiconductor materials for RIRs, preferred material include: GaN for the AlGaN/GaN/GaInN system; ZnSe for the ZnCdSSe/GaAs system; GaP for the AlGaInP/GaAs system; GaP for the AlGaAs/GaAs system; GaAs and GaP for the InGaAs/GaAs/AlGaAs system; Si and GaAs for the GaInAsP/InP system; and Si and GaAs for the AlGaInSbAs/GaAs system. These laser designs can be successfully implemented by using the recently developed "wafer bonding" technology; see, e.g., H. Wada et al., *IEEE Photon. Technol. Lett.*, Vol. 8, p. 173 (1996). The designs for efficient injection lasers are applicable for at least all the foregoing ranges of laser-radiation wavelengths and heterostructure systems.

With reference now to FIGS. 1 and 11, the preferred laser 1 includes a heterostructure 2, which comprises an active layer 3 positioned between two cladding layers 4 and 5, respectively, with sublayers $I_i$ and $II_j$ (not shown). Active layer 3 consists of two active sublayers and a barrier sublayer that separates them (not shown in FIG. 1). The length of the $L_{GR}$ is about 4000 $\mu$m. The length of the optical resonator $L_{OR}$ is about 3760 $\mu$m (see equation (1)), and the ratio $\mu$ (equation (1)), is equal to about 0.9397. The width $W_{GR}$ in the form of a strip 30 (or mesa strip) bounded on the sides by barrier regions 6 is about 400 $\mu$m. The total width of the laser crystal is about 1000 $\mu$m. A semiconductor RIR 7, bounded on the end faces by facets 8 and 9, which are implemented as reflectors of the optical resonator, is located on the surface, distant from active layer 3, of sublayer $II_m$ of cladding layer 5. RIR 7 is implemented as a substrate 10 to which the required form is imparted. Both facets of RIR 7, the first facet 8 and second facet 9, are inclined with a positive angle of inclination ψ equal to the outflow angle φ, which is about 20°. This angle ψ is calculated from the normal plane, which is perpendicular to the longitudinal gain axis in the GR. If the angle of inclination ψ is positive, facets 8 and 9 subtend an acute angle with active layer 3. A reflective coating 11 with a reflection coefficient $R_1$ of about 0.999 is formed on the first facet 8, and a partially reflective coating 12 with a reflection coefficient $R_2$ of about 0.01 is formed on the second facet. The end surfaces 13, which determine the length of the gain region $L_{GR}$, are an extension of the corresponding planes of the inclined facets 8 and 9 and have the same inclinations and the same reflection coefficients as facets 8 and 9. This simplifies the fabrication technology. This simplification does not have any practical effect on the parameters of laser 1, since strong outflow is realized in the preferred laser 1, and there is practically no laser radiation through end surfaces 13. The accuracy with which the facets 8 and 9 are inclined may range from about 19.6° to 20.4°. The thickness $d_{RIR}$ of RIR 7, for which the relation $$d_{RIR} \geq (L_{RIR} \cdot \tan \phi/(1+\tan^2 \phi)), \qquad (15)$$

is fulfilled, is about 1,286 μm. Contact layer 14 is positioned on the surface of sublayer $I_k$ of cladding layer 4, and an ohmic contact 15 is formed on it. An ohmic contact 16 is made on the opposite side of RIR 7, on its outer surface 17 of RIR 7 (in this case, on the surface of substrate 10). Inner surface 18 borders on heterostructure 2, and is parallel to the plane of active layer 3.

Heterostructure 2, which comprises a number of semiconductor layers and sublayers 19–27, together with contact layer 14, may be grown by the conventionally known method of Metal Organic Chemical Vapor Deposition (MOCVD) on substrate 10 from electrically conductive gallium arsenide. The composition, thicknesses, refractive indices, type, doping concentrations, and absorption coefficients of layers 19–27 of heterostructure 2, contact layer 14, and RIR 7 are presented in the Table. This heterostructure 2 also is used in the following embodiments (with the changes specified for the separate embodiments). The operating wavelength for this heterostructure 2 is about 980 nm. In FIG. 1 and in subsequent FIGS. 2–10, 14, 16–18, and 20–25 conventional arrows show the directions of propagation of laser radiation in RIR 7 and outside it. The laser 1 is mounted on a thermally conductive slab (not shown in FIGS. 1–25) against the side of ohmic contact 15. The power is supplied to ohmic contacts 15 and 16.

The basic parameters for both the laser 1, and modifications of it, were obtained by numerical modeling performed according to a program employing a matrix method of solving Maxwell's equations with the corresponding boundary conditions for the multilayer laser heterostructures (see, e.g., J. Chilwall and I. Hodkinson, *Journ. Opt. Soc. Amer.*, A (1984), Vol. 1, No. 7, pp. 742–753). The calculations employed the following initial parameters: the material gain in active layer 3 for achieving inversion was about 200 cm$^{-1}$, the proportionality factor between the gain and injected-electron concentration in active layer 3 was about $5 \times 10^{-16}$ cm$^2$, and the lifetime of the nonequilibrium electrons in active layer 3 was 1 ns.

The calculations also assumed: an optical loss factor $\alpha_{GRO}$ in the GR of about 3 cm$^{-1}$ (see, e.g., D. Z. Garbuzov et al., *IEEE Journ. of Quant. Electr.* (1997), Vol. 33, No. 12, pp. 2266–2276) and in accordance, for example, with H. C. Huang et al. (*Journ. Appl. Phys.* (1990), Vol. 67, No. 3, pp. 1497–1503), and with a value of the optical loss factor $\alpha_{RIR}$ of the laser radiation in RIR 7 of about 0.1 cm$^{-1}$. The losses to output of spontaneous radiation through end surfaces 13 of the gain region were not taken into account in the calculations because of their smallness, so that $\alpha_{GR}$ (equation (11)), is about 3 cm$^{-1}$. The values adopted for the parameters are typical of the laser heterostructure 2 in question, which is based on InGaAs/GaAs/AlGaAs. For a heterostructure 2 using other compounds, such as GaInPAs/InP, these parameters may change somewhat.

The following results were obtained by numerical calculation:

the threshold current density $j_{thr}$ was determined to be about 89.3 A/cm$^2$ (equation (3) is fulfilled for this current density);

the outflow angle φ is about 20°;

the dispersion angle of divergence Δφ for the outgoing spontaneous radiation (for the Δλ of 30 nm used in the calculation) was found to be about 0.8°;

the effective refractive index $n_{eff}$ is about 3.3124;

the total gain $G_{GR}$ and gain $G_{outflow}$ for the outgoing radiation (reached for a current density $j_{oper}$ of about 2,500 A/cm$^2$ through laser 1) are about 320.80 cm$^{-1}$ and 320.03 cm$^{-1}$, respectively; here the difference ($G_{GR}-G_{outflow}$), which is about 0.73 cm$^{-1}$, is smaller than $\alpha_{GR}$ (equation (11)), which is about 3 cm$^{-1}$, which means that the mode of intensive outflow has been selected, and that lasing did not occur in the GR;

the net loss factor $\alpha_{out}$ (equation (4)), for the output laser radiation from RIR 7 is about 11.515 cm$^{-1}$;

the optical loss factor, defined as $\mu \cdot \alpha_{RIR}$, is about 0.09397 cm$^{-1}$;

the threshold loss factor $\alpha_{RIR-thr}$ (equation (3)), in RIR 7, defined as the sum ($\alpha_{out}+(\mu \cdot \alpha_{RIR})+\alpha_{diffr}$), is equal to about 11.609, and the $\alpha_{diffr}$ calculated from equation (5) is negligibly small;

the area of the gain region $S_{GR}$ is about $1.6 \times 10^{-2}$ cm$^2$;

the threshold current $J_{thr}$, defined as ($j_{thr} \cdot S_{GR}$), is about 0.8 A;

the differential efficiency $\eta_d$ is about 0.9827 (see equation (8)), and its components $\eta_1$ (equation (9)) and $\eta_2$ (equation (10)) are about 0.9907 and 0.9919, respectively; and the threshold loss factor $\eta_{thr}$ (equation (13)) for a $j_{oper}$ of about 2,500 A/cm$^2$ is 0.9643, and the efficiency η (equation (12)) of laser 1 is 0.9476.

The output power P(W) of laser radiation is determined as:

$$P = \eta \cdot J \cdot (hv), \qquad (16)$$

where J is the operating current through the device, equal to about 40 A, and (hv) is the photon energy in volts, equal to about 1.265 V. The value obtained for P is about 47.95 W. The radiation near-field area (output aperture) $S_{ap}$, defined as ($d_{ap} \cdot W_{GR}$), is equal to about $0.51 \times 10^{-2}$ cm$^2$, where $d_{ap}$ is equal to $L_{GR} \cdot \sin \phi$, specifically 1,368 μm, and $W_{GR}$ is approximately 400 μm. The angles of divergence $\Theta_1$ and $\Theta_2$ of the output radiation were respectively estimated as the wavelength λ, divided by $d_{ap}$, and the wavelength λ, divided by $W_{GR}$. In the vertical plane, the angle $\Theta_1$ was found to be about 0.72 mrad. In the horizontal plane the angle $\Theta_2$ is about 2.45 mrad for the range of currents for which monomode lasing can be maintained. The output of laser radiation on the output facet 9, defined as $P/S_{ap}$, is about 9,402 W/cm$^2$.

Another embodiment of laser 1 (see FIG. 2) differs from the one described above with regard to FIG. 1 in that an antireflective coating 28 was applied to facet 8, and outer reflector 29 was implemented as a plane mirror measuring approximately 2,500×2,500 $\mu m^2$, with a reflection coefficient of about 0.999, which was parallel to facet 8 and approximately 10,000 $\mu m$ from it. The width $W_{GR}$ was 1,368 $\mu m$, and the total width of the laser crystal was approximately 3,000 $\mu m$. The basic parameters of laser 1 in this embodiment that differ from the first embodiment are: $S_{GR}$, $J_{thr}$, $J_{oper}$, P (equation (16)), and $S_{ap}$ are respectively equal to about $5.47 \times 10^{-2}$ $cm^2$, 1.43 A, 136.75 A, 163.9 W, and $1.87 \times 10^{-2}$ $cm^2$, and $\Theta_1$ and $\Theta_2$ are identical and are equal to approximately 0.72 mrad.

The difference between the laser depicted in FIGS. 10 and 11 and the one shown in FIG. 3 is that facets 8 and 9 of RIR 7 were made with an angle of inclination $\psi$ of zero. As a result of the increase in the thicknesses of layers 21 and 25 of heterostructure 2 (see Table), the outflow angle $\phi$ was reduced to approximately 12°, which is smaller than the angle σ. Here, the plane of external reflectors 29 for providing negative feedback was adjusted with an angle of inclination relative to the normal plane of about 42.3°, and the angle $\Delta\phi$ was about 1.4°. Laser 1 had unidirectional radiation output, since one reflector had a reflective coating 11 with $R_1$ of about 0.999, and the other had a coating 12 with $R_2$ of about 0.05. In addition to the known advantages inherent in lasers with external resonators (such as, the enhancement of spatial and spectral characteristics), another advantage is simplified fabrication.

The laser 1 of FIG. 4 and FIG. 11 differed from the last shown in FIG. 1 in that both facets 8 and 9 of RIR 7 have a negative angle of inclination $\psi$ equal to $(\pi/4-\phi/2)$, specifically 35°. The length $L_{RIR}$ is approximately 1,000 $\mu m$ and the width $W_{GR}$ is approximately 340 $\mu m$. The thickness $d_{RIR}$ of RIR 7 is about 500 $\mu m$, and its length $L_{ORIR}$ is about 1,700 $\mu m$. A reflective coating 11 with a reflection coefficient $R_1$ of about 0.999 is formed on the outer surface 17 at the location of the projection of facet 8 onto it, and a partially reflective coating 12 with a reflection coefficient $R_2$ of approximately 0.02 is formed at the point of the projection of the other facet 9. The length $L_{OR}$ of the optical resonator, defined as $\mu \cdot L_{GR}$ (equation (1)), is about 1,940 $\mu m$, and the ratio $\mu$ equals 1.94. The following parameters were obtained for this laser 1:

the threshold current density $j_{thr}$ is about 42 $A/cm^2$;

the loss factors $\alpha_{out}$ and $\mu \cdot \alpha_{RIR}$ are about 3.913 $cm^{-1}$ and 0.194 $cm^{-1}$, respectively;

the $\alpha_{diffr}$ calculated from equation (5) is negligibly small, and consequently $\alpha_{RIR-thr}$ (equation (3)) is about 4.107 $cm^{-1}$;

the efficiencies $\eta_1$, $\eta_2$, $\eta_d$, $\eta_{thr}$, and $\eta$ are respectively 0.9907, 0.958, 0.9439, 0.9832, and 0.9280;

the threshold current $J_{thr}$ is about 0.143 A for an $S_{GR}$ of about $0.34 \times 10^{-2}$ $cm^2$; and the operating current $J_{oper}$ is approximately 8.5 A (for a $j_{oper}$ of 2500 $A/cm^2$), and the output power P (equation (16)) of laser 1 under conditions of a single spatial mode is about 9.98 W, while the angles of divergence $\Theta_1$ and $\Theta_2$ are identical and are equal to about 2.8 mrad.

The laser 1 depicted in FIGS. 5 and 11 differs from the one in FIG. 4 in that one of the reflectors of the optical resonator is external and is implemented as a reflective diffraction grating 29. This grating enables single-frequency lasing.

In laser 1 shown in FIGS. 8 and 11 both facets 8 and 9 are inclined at a positive angle $\psi$ equal to $(\pi/4+\phi/2)$, specifically about 55°, and the output radiation is directed at a right angle to the plane of active layer 3 in the direction toward the heterostructure 2. The GR, of width about 15.3 $\mu m$ and length 45 $\mu m$, is located in the middle of inner surface 18, whose width $W_{IRIR}$ is about 25 $\mu m$ and whose length $L_{IRIR}$ is about 135 $\mu m$. Coatings 11 and 12, whose reflection coefficients are about 0.999 and 0.90, respectively, are applied to the inner surface 18 at the points of projection of facets 8 and 9. A barrier region 6 is formed on the remaining area of inner surface 18, which is free of heterostructure 2 and coatings 11 and 12. The thickness of RIR 7 is 23 $\mu m$, the length of the outer surface 17 is about 73.8 $\mu m$, and the length $L_{OR}$ of the optical resonator was about 129 $\mu m$. The aforementioned design changes determined the following parameters: $j_{thr}$ is about 125 $A/cm^2$, and $\alpha_{out}$, $\alpha_{diffr}$, $\mu$, and ($\mu \cdot \alpha_{RIR}$) are respectively about 11.7 $cm^{-1}$, 4.22 $cm^{-1}$, 2.86, and 0.286 $cm^{-1}$, and consequently $\alpha_{RIR-thr}$ is about 16.2 $cm^{-1}$. The threshold current J is about 0.861 mA, the operating current $J_{oper}$ is about 13.8 mA, the output power P (equation (16)) of the laser radiation is about 11.66 mW, and $\eta_d$ (equation (8)) and $\eta$ (equation (12)) are about 0.7139 and 0.6693, respectively. This laser 1 generates in a single longitudinal mode, its wavelength is practically independent of the pumping current over a wide range thereof, and the angles of divergence $\Theta_1$ and $\Theta_2$ are identical and are equal to 6.4 mrad (0.37°). This laser, in addition to the others (see FIGS. 4 and 6–9) is competitive with conventional lasers having vertical resonator (see, e.g., B. Weigl et al., *Electronics Letters*, Vol. 32, No. 19, pp. 1784–1786, 1996).

The laser 1 depicted in FIGS. 7 and 11 differs from those shown in FIGS. 10, 4, and 8 in that the facets 8 and 9 are made different in sign but identical in absolute value of the angle of inclination $\psi$, which is approximately 30°. This design makes it possible to obtain output radiation directed at a right angle to the plane of active layer 3, but for smaller values of the ratio $\mu$, see, e.g., equation (1), than for some of the lasers described above.

What is common to the lasers 1 in FIGS. 3, 6, and 9 is that facet 8 of RIR 7 is made with an angle of inclination $\psi$ of about zero. For the lasers 1 made in accordance with the design in FIGS. 1, 4, and 8, this configuration leads to a doubling of the linear size of the radiation output aperture, with a corresponding decrease in the angle of divergence $\Theta_1$ in the vertical plane, provided that the lengths $L_{GR}$ are kept the same.

In the lasers shown in FIGS. 1–10, mesa strip 30, which determines the dimensions of the GR, may be made of a specified width by using barrier regions 6 (see FIGS. 11–13). For a laser 1 with a mesa strip 30 with a width of micron size, ohmic contact 16 can be made, for example, with sublayer 25 of cladding layer 5, as shown in FIG. 12. In this case, RIR 7 may be an insulating region, which facilitates the selection of RIR 7 with a small coefficient $\alpha_{RIR}$. If a two-layer RIR 7 comprising a first electrically conductive layer 31 and a second insulating layer 32 is present, ohmic contact 16 is made with the first layer 31 (FIG. 13). In this case, the second layer 32 of RIR 7 may be not only an insulating layer, but also a layer that differs in composition from first layer 31, which also facilitates the selection of both small values of $\alpha_{RIR2}$ and corresponding thicknesses $d_{RIR2}$ of layer 32, provided that the refractive index of the layers of RIR 7 are selected appropriately.

The lasers 1 in FIGS. 14–21 differ from the ones described above in that their designs include two or more (i.e., a multiplicity of) gain regions. A characteristic feature of the multibeam laser 1 shown in FIGS. 14 and 15 is that 32×30 GRs are disposed on the inner surface 18 of RIR 7 and are series and parallel electrically coupled to together for the passage of the operating current therethrough. The length and width of each GR are approximately 290 and 85 μm, respectively. They are arranged in the form of a rectangular grating whose spacings along (x) and across (y) the length $L_{IRIR}$ of the RIR are approximately 300 and 100 μm, respectively. The length $L_{IRIR}$ and width $W_{IRIR}$ of the inner surface 18 of RIR 7 are approximately 9,600 and 3,000 μm, respectively, the thickness of RIR 7 is 3,214 μm, the length $L_{OR}$ of the optical resonator is approximately 10,216 μm, and the reflection coefficients of coatings 11 and 12 on facets 8 and 9 are about 0.999 and 0.32, respectively. The basic parameters for the laser beams from each GR, $j_{thr}$, $\alpha_{out}$, $\mu$, and $(\mu \cdot \alpha_{RIR})$, have values of about 182 A/cm², 19.95 cm⁻¹, 35.2, and 3.52 cm⁻¹, respectively, and consequently $\alpha_{RIR-thr}$ is about 23.47 cm⁻¹; the threshold current $J_{thr}$ is about 43.7 mA, the operating current $J_{oper}$ is selected to be approximately 600 mA, and the output power of laser monomode radiation P (equation (16)) is about 592.6 mW. Here, $\eta_d$ (equation (8)) is 0.8421, and $\eta$ (equation (12)) is about 0.7808, and the angles of divergence $\Theta_1$, and $\Theta_2$ are about 9.0 mrad and 8.28 mrad, respectively.

Thirty GRs, which are in each of 32 rows of the grating that are positioned across the length of the RIR, are electrically interconnected in series, and the rows themselves are connected in parallel. The galvanic series coupling of the aforementioned GRs is implemented (see FIG. 15 and FIG. 14) by introducing an electrically conductive first layer 31 (with a carrier concentration of approximately 10¹⁸ cm⁻³) of RIR 7, an insulating region 35 of width 15 μm, metallization layers 36 to ohmic contacts 15, connecting ohmic contacts 15 of two such adjacent GRs, between which is an insulating region 35 that borders (in contrast to barrier region 6) on the insulating region with layer 32 of RIR 7 (see FIG. 15). The aforementioned metallization layers 36, which also provide a parallel current connection of the aforementioned 32 rows of GRs, are implemented as 16 lines approximately 180 μm wide and 9,600 μm long. In the working device, to each GR there will correspond a radiation near field and an output laser beam on the reflector with a partially reflective coating 12. If the dimensions, the length of the optical resonator and the length of the GR itself are chosen properly, they will not overlap (see FIG. 14). The total operating current through laser 1 is about 3.2 A for an operating voltage of 48 V (1.6 V for each GR), and the total output power of all laser beams is about 568.9 W.

A characteristic feature of the lasers 1 depicted in FIGS. 16–19 is that a common RIR 7 with common facets 8 and 9 is formed for a linear sequence (or linear array) of GRs. The line of intersection of the plane of the active layer with the extension of the planes of facets 8 and 9 subtends a right angle with the gain axes of the gain regions in the aforementioned linear array. The device may contain a fairly large number of such linear arrays, which are monolithically joined by heterostructure 2 with barrier regions 6, which is common to all the linear arrays. A separate laser beam will correspond to each GR in each such line of GRs. The direction of radiation output from such multibeam lasers 1, with a multiplicity of separate GRs, may be either perpendicular to the plane of active layer 3 (see FIGS. 16 and 17) or at an angle φ (see FIG. 18). In contrast to lasers 1 in FIGS. 14 and 15, the thickness of RIR 7 in lasers 1 FIGS. 16–19 may be reduced significantly, and the density of the laser beams per square centimeter may be significantly increased.

In the laser 1 depicted in FIGS. 16 and 19, 32 linear sequences or array of GRs, each of which contains 30 GRs that have the same dimensions and parameters as the laser 1 in FIGS. 8 and 11, are made on the inner surfaces 18 of the 32 RIRs 7. With the exception of its width of approximately 750 μm, RIR 7 has the same dimensions and characteristics as the laser 1 in FIGS. 8 and 11. On each of four sides, the GRs are current separated by barrier regions 6, and an independent ohmic contact 15 with contact layer 14 is made by known methods. The spacing of the GRs in the line is about 25 μm, and the spacing between lines is about 135 μm. For independent supply of operating current to each GR, 30 longitudinal strips of metallization layers 36 are made to ohmic contacts 15, and 32 transverse strips of metallization layers 37, which are directed transverse to the optical gain axes of the GRs, are formed to the ohmic contacts 16 of each of the 32 RIRs. When an electrical signal is supplied to an arbitrary combination of two mutually perpendicular metallization strips 36 and 37, the laser beam is generated with the involvement of that GR which is disposed between intersecting strips 36 and 37 of the selected metallization strips. Each laser beam (of which there are 960 in all) has the same parameters as in the laser 1 in FIGS. 9 and 11.

The laser 1 shown in FIGS. 20 and 21 include several GRs that are connected in series, one after another, into a common optical resonator. This is accomplished by virtue of reflections from the outer optical surface 17 of RIR 7 (see FIG. 20) and by virtue of reflections, with corresponding gain in laser radiation from gain regions disposed on both surfaces of RIR 7 (see FIG. 21). These embodiments provide an increased effective length of the optical resonator for smaller thicknesses of RIR 7, including situations with large outflow angles φ. Furthermore, in them conditions more conducive to heat removal are provided as a result of the distributed nature of the heat sources in the gain regions.

Note also that for the laser 1 described with reference to FIGS. 14–21, certain electrical connections of the longitudinal and transverse strips of metallization layers 36 and 37 can be used to obtain series, parallel, or series-parallel galvanic coupling of the gain regions. This design makes it possible to perform more effective matching of high-power multibeam lasers to power sources.

The following laser 1, unlike the ones described above in connection with FIG. 20, has one strip-type GR with length $L_{GR}$ and width $W_{GR}$. The RIR 7 is in the form of a rectangular parallelepiped and includes one layer with a thickness $d_{RIR}$ that is located above the lower contact layer 14 (which may be necessary, depending on the materials employed in the laser 1). The other ohmic contact 16 (with the corresponding metallization layers) is located on the outer optic surface 17, except on portions of the outer surface of the RIR where the strip-type GR is projected onto this outer surface. The reflectors of the optical resonator are disposed on optical facets of the RIR. The size of the optical facets 8, 9 is at least equal to the product of the thickness $d_{RIR}$ and the width $W_{GR}$.

In another embodiment of the laser 1, the entire outer surface 17 of the RIR 7 is covered with a semiconductive layer with a refractive index smaller than $n_{eff}$. The outer surface 17 of the RIR 7 may, for example, be covered with a material having a refractive index equal to $n_{min}$, i.e., the lowest refractive index of the semiconductive materials of the cladding layers 4 and 5 of heterostructure 2. Preferably, the contact semiconductive layer 14 (if necessary) has a band gap smaller than that of the semiconductor layer on the outer surface 17 of the RIR 7. The ohmic contact 16 is located above this semiconductor layer on the outer surface having index $n_{min}$.

In yet another embodiment of the laser 1, the region of injection or region of gain comprises a portion that starts out as a rectangular strip about 2 to 5 μm in width and from about 0.5 to several millimeters in length but which widens to form a funnel-shaped injection region. The funnel shaped region is flared at an ranging from about 5° to 15° over a length which may range from about 0.5 to 2 mm or more. Such a configuration enables the reduction of the threshold currents of laser 1, leading to the further increase in its efficiency. In addition, this configuration allows for the significant reduction of the angle of divergence $\theta_2$ of laser radiation in the horizontal plane at the exit of the funnel.

A laser is also possible having an RIR 7 on both sides of the active layer 3 of the heterostructure 2.

In these four embodiments described above, as well as in the laser 1 depicted in FIG. 20, wherein a semiconductor is disposed on the outer surface 17 of the RIR 7, the radiation flows into the RIR 7 approximately in the form of two flat waves directed at outflow angles $\phi$ in two opposite directions, see, e.g., equation (2). In addition, if the thickness $d_{RIR}$ is smaller than $L_{IRIR}$ multiplied by tan $\phi$, a portion of the outflowing radiation would, after falling on the semiconductor layer of the outer surface 17 on the RIR with an index $n_{min}$ be completely reflected from it. Subsequently, the reflected radiation will return to the GR of the heterostructure 2 where it is re-radiated back into the RIR 7. Once in the RIR 7, the light will be totally internally reflected from the semiconductor layer with an index $n_{min}$ once again. This process will continue to repeat itself. The number of such radiation re-reflections is determined mainly by the value of the angle $\phi$, determined by equation (2), the thickness $d_{RIR}$ of RIR 7, and the length, $L_{GR}$, of the injection region.

The resulting radiation into the RIR 7 will be directed approximately along the respective perpendiculars to the reflectors of the optical resonator of the laser 1. These reflectors are located on the optical facets of the RIR 7 through which laser radiation will primarily be emitted.

The shape and size of the near-field radiation pattern of the laser 1 at on the optical facets of the RIR 7 will be restricted by the size of the rectangular facets, one of the sides of which is slightly greater than the thickness $d_{RIR}$, the other side being slightly greater than the width W of the strip of the injection region. Accordingly, the angle of divergence $\Theta_1$ in the vertical plane may be estimated as approximately equal to the wavelength $\lambda$ of the radiation divided by the thickness $d_{RIR}$ of the RIR 7. By selecting the thickness $d_{RIR}$, it is possible to reduce the angle of divergence $\Theta_1$ as well as the density of radiation, which is important for obtaining high output power and a high reliability for the Laser 1. This thickness $d_{RIR}$ preferably ranges from about 2 to 100 $\mu$m and in certain cases may be smaller than about 2 $\mu$m.

It is also important to note that, with respect to the embodiments of Laser 1 described above, as a result of the reduction of the thickness $d_{RIR}$ of RIR 7, it is not necessary to rely on wafer bonding technology. In contrast, the heterostructure 2, along with the RIR 7, the semiconductor layer with index $n_{min}$ formed thereon, as well as the contact layer 14 may be deposited in the single process of epitaxial growth. This approach simplifies the manufacturing process and enables less expensive manufacturing equipment to be employed to fabricate a variety of laser which operate at different wavelengths $\lambda$.

The laser depicted in FIGS. 22 and 11, in contrast to the ones described above with regard to FIGS. 1 and 11 has three strip-type gain regions (GR), a middle GR surrounded by two end GRs with contacts 14 at the end of the cladding layer 4. The thickness $d_{RIR}$ of RIR 7 has been selected to be at least as large as the value of thickness $d_{RIR}$ by formula (15) where $L_{IRIR}$ is replaced by the length of the end GR designated hereinafter as $L_{GRE}$. The thickness of the cladding layer 5 of the middle GR is greater than the thickness of the end GRs, for example, the thickness of the layer 5 in the middle GR may be equal to the thickness of layer 4 as shown in FIG. 22. In an operating laser 1, at the current densities discussed above, the intensity of outgoing radiation in the end GRs is significantly greater than the intensity of outgoing radiation in the middle GR, where it is practically nil. As a result of this phenomenon, stimulated (super-luminescent) radiation of a sufficient power is introduced from the middle GR to the end GRs. This stimulated (super-luminescent) radiation enables electrical power introduced into the end GRs to be converted into a directed radiation in a highly efficient process which generates laser radiation. This generation occurs in the optical resonator which includes the middle and end GRs, as well as a portion of the RIR 7. The reflectors of the optical resonator comprise one optical facet 8 having a reflective coating 11 thereon and the other optical facet 9 with a partially reflective coating 12 adhere thereto. This design advantageously has a low threshold current density $j_{thr}$, a high conversion efficiency $\eta$, and a thickness $d_{RIR}$ of the RIR 7 that is small as compared to the thickness of the RIR in the laser 1 discussed above with regard to FIGS. 1 and 11. Having a small thickness $d_{RIR}$ allows for the growth of the RIR layer 7 by the methods of epitaxial growth, thereby simplifying the process of manufacture.

The laser 1 shown in FIGS. 23 and 11 differs from that of FIG. 22 in that an identical single-layer RIR 7 and an identical cladding layer 5 are associated with all three GRs, the middle and two ends. Nevertheless, the current density in the middle GR of the operating laser 1 has a value that allows for super-luminescent radiation flowing from the middle GR into the end GRs to be much higher than the radiation outgoing from the middle GR. The selection of heterostructures achieving these requirements was made by employing numerical methods.

Another embodiment of the laser 1 (not shown) is similar to the laser shown in FIG. 22 except that the contact layer 14 and the ohmic 15 are continuous. This design produces equal current densities through the middle and end GRs and advantageously offers simplicity of operation.

Note that these design features extend to the laser 1 depicted in FIGS. 2–10 and 14–19, and 20–21 as well as to the laser of FIG. 1.

The laser 1 depicted in FIGS. 24 and 11, unlike the laser 1 in FIG. 22, has an RIR 7 shaped as a rectangular parallelepiped with a small thickness $d_{RIR}$, which preferably ranges from about 2 to about 10 $\mu$m. This thickness can be much smaller than the length of the end GR, $L_{GRE}$, multiplied by tan $\phi$. A semiconductive layer 38 with a refraction factor $n_{min}$ is located on the outer surface 17 of the RIR 7 similar to the one described above. The construction of the RIR 7 and the functioning of the semiconductor layer formed on the outer surface 17 of the RIR are similar to those described above in connection for example with the laser 1 of FIG. 20. The design of FIG. 24 advantageously reduces the generation threshold and increases efficiency.

The laser 1 depicted in FIG. 25 differs because it contains two outflow regions 7 located on both sides of the active layer 3 which like the RIR in the laser of FIG. 24 comprises relatively thin layers. The two outflow regions 7 also have associated therewith adjacent semiconductive layers 38. In this embodiment, the layers of RIR 7 and cladding layers 5 are identical for all three GRs. Functionally, this embodiment is similar to the laser 1 depicted in FIG. 23; in the operating laser 1, the current density in the middle GR is greater than in the end GRs.

In addition to the embodiments described above, lasers 1 with two GRs could be also be used, the first of these GRs being similar in construction to the middle GR, while the second one being similar to the end GR. While the first GR preferably comprises the strip-type, the second one can preferably is funnel-shaped, widening from the strip of the first GR.

Thus, in the lasers 1 described herein, the output power of the laser radiation is increased manifold, the threshold current densities are reduced significantly and the angles of divergence in two mutually perpendicular directions are reduced, the effective lengths of optical resonators are increased, near-maximum values of the efficiencies (including the differential efficiency) are attained, and the dependence of the generated wavelength of the laser radiation on the pumping-current amplitude is reduced significantly. High-efficiency lasers with output of laser beams, including output in the direction perpendicular to the plane of the active layer, and multibeam lasers, including those turned on independently, also are obtained.

In general injection lasers are used in fiber-optic communications and data-transmission systems, in ultra-high-speed optical computing and switching systems, in the design of medical equipment, laser process equipment, and frequency-doubled lasers, and for the pumping of solid-state and fiber lasers. Accordingly, the injection lasers described above can be advantageously employed in these various application as well as numerous others.

Moreover, the present invention may be embodied in other specific forms without departing from the essential characteristics as described herein. The embodiments described above are to be considered in all respects as illustrative only and not restrictive in any manner. The scope of any invention is, therefore, indicated by the following claims rather than the foregoing description. Any and all changes which come within the meaning and range of equivalency of the claims are to be considered in their scope.

TABLE

| Names & Nos. of layers, sublayers, & regions 1 | | | Composition of layer 2 | Thickness of layer d ($\mu$m) 3 | Refractive index n 4 | Type of conduction 5 | Carrier concentration $N_e$ (cm$^{-3}$) 6 | Absorption coefficient $\alpha$ (cm$^{-1}$) 7 |
|---|---|---|---|---|---|---|---|---|
| Contact layer | 14 | | GaAs | 0.3 | 3.525 | P | $2 \times 10^{19}$ | 140 |
| Cladding layer, sublayers | 4 | 19 | $Al_{0.6}Ga_{0.4}As$ | 0.9 | 3.20 | P | $1 \times 10^{18}$ | 7.0 |
| | | 20 | $Al_{0.6}Ga_{0.4}As$ | 0.6 | 3.20 | P | $2 \times 10^{17}$ | 3.50 |
| | | 21 | GaAs | 0.06 | 3.525 | — | — | 3.0 |
| Active layer, sublayers | 3 | 22 | $In_{0.2}Ga_{0.8}As$ | 0.008 | 3.63 | — | — | 3.0 |
| | | 23 | GaAs | 0.012 | 3.525 | — | — | 3.0 |
| | | 24 | $In_{0.2}Ga_{0.8}As$ | 0.008 | 3.63 | — | — | 3.0 |
| Cladding layer, sublayers | 5 | 25 | GaAs | 0.06 | 3.525 | — | — | 3.0 |
| | | 26 | $Al_{0.6}Ga_{0.4}As$ | 0.1 | 3.20 | N | $5 \times 10^{17}$ | 2.0 |
| | | 27 | $Al_{0.6}Ga_{0.4}As$ | 0.25 | 3.20 | N | $1 \times 10^{18}$ | 3.0 |
| Radiation inflow region | 7 | | GaAs | 1286.0 | 3.525 | N | $1 \times 10^{18}$ | 0.1 |

What is claimed is:

1. An injection laser comprising at least one gain region having a longitudinal gain axis and outputting laser radiation defined by an outflow angle $\phi$, said injection laser comprising:

a laser heterostructure comprising:
      an active layer forming said at least one gain region;
      cladding layers comprising at least one layer having a refractive index, and at least one radiation inflow region adjoining said laser heterostructure comprising at least one portion that is transparent to said laser radiation, has a refractive index $n_{RIR}$, and is located on at least one side of said active layer, said radiation inflow region including at least one optical facet, an outer surface, and an inner surface, said optical facet being oriented at an angle of inclination $\psi$ with respect to a plane perpendicular to said longitudinal gain axis; and reflectors that together form an optical resonator at least part of which coincides with at least part of said radiation inflow region and at least part of said gain region, wherein said laser heterostructure and said adjoining radiation inflow region together have an effective refractive index $n_{eff}$ such that $n_{RIR}$ exceeds $n_{eff}$;

$\arccos(n_{eff}/n_{RIR}) \leq \arccos(n_{eff\text{-}min}/n_{RIR})$;

and $n_{eff\text{-}min}$ is greater than $n_{min}$, where $n_{eff\text{-}min}$ is the minimum value of $n_{eff}$ for laser heterostructures with radiation inflow regions that produce outflow of radiation from the active layer into the radiation inflow region, and $n_{min}$ is the smallest of the refractive indices in the cladding layers of the heterostructure.

2. The injection laser of claim 1, wherein said active layer comprises at least one sublayer.

3. The injection laser of claim 2, wherein said cladding layers are respectively disposed on a first surface and on an opposite second surface of said active layer and comprise cladding sublayers $I_i$ and $II_j$, respectively, with refractive indices $n_{Ii}$ and $n_{IIi}$ and bandgaps $E_{Ii}$ and $E_{IIi}$, respectively, where i=1, 2, ..., k and j=1, 2, ..., m are defined as integers that designate the sequential numbers of the cladding sublayers counted from the active layer with at least one cladding sublayer within each cladding layer.

4. The injection laser of claim 3, wherein at least one of said cladding sublayers disposed between said active layer and said radiation inflow region is electrically conductive and has an ohmic contact formed therewith.

5. The injection laser of claim 4, wherein at least two of said cladding sublayers disposed between said active layer and said radiation inflow region comprise electrically conducting semiconductors having bandgaps of varying sizes, said ohmic contact being formed with said sublayer having the smallest bandgap.

6. The injection laser of claim 3, wherein at least one of said cladding sublayers has a refractive index at least as large as the refractive index $n_{RIR}$ of said radiation inflow region.

7. The injection laser of claim 1, wherein said at least one optical facet is oriented so as to subtend an acute angle with the inner surface.

8. The injection laser of claim 1, wherein said laser heterostructure includes barrier regions.

9. The injection laser of claim 1, wherein said gain region comprises a strip-type gain region.

10. The injection laser of claim 1, wherein:
said gain region has a length $L_{GR}$ and a width $W_{GR}$ and
said inner surface of the radiation inflow region has a length $L_{RIR}$ and a width $W_{RIR}$ respectively at least as large as the length $L_{GR}$ and width $W_{GR}$ of said gain region.

11. The injection laser of claim 10, wherein said radiation inflow region includes a first layer that borders said laser heterostructure and is electrically conductive, said radiation inflow region having a second layer that comprises material having an optical loss factor $\alpha_{RIR}$ of no more than about 0.1 cm$^{-1}$.

12. The injection laser of claim 11, wherein an ohmic contact is formed with said electrically conductive portion of said radiation inflow region.

13. The injection laser of claim 1, wherein said radiation inflow region has a thickness ranging between about 2 to about 50,000 micrometers ($\mu$m).

14. The injection laser of claim 1, wherein said radiation inflow region comprises an optically homogeneous material.

15. The injection laser of claim 14, wherein said radiation inflow region comprises a semiconductor having a bandgap $E_{RIR}$ (eV) and said active layer comprises a semiconductor having bandgap $E_a$ (eV), said bandgap $E_{RIR}$ (eV) exceeding said bandgap $E_a$ (eV) of the active layer by more than about 0.09 eV.

16. The injection laser of claim 1, wherein said radiation inflow region comprises a substrate.

17. The injection laser of claim 1, wherein said radiation inflow region is electrically conductive.

18. The injection laser of claim 17, wherein an ohmic contact is formed with said radiation inflow region.

19. The injection laser of claim 1, wherein a portion of said radiation inflow region comprises a plurality of layers oriented parallel to said inner surface.

20. The injection laser of claim 19, wherein said plurality of layers comprises materials having different refractive indices.

21. The injection laser of claim 1, wherein said radiation inflow region has an optical loss factor $\alpha_{RIR}$ of no more than about 0 .1 cm$^{-1}$.

22. The injection laser of claim 1, wherein:
said gain region is bounded at two opposite ends by two edge surfaces;
at least one of said edge surfaces is inclined at an angle with respect to said inner surface, said angle being identical to an angle formed between one of said adjacent optical facets with said inner surface; and
said edge surface has a reflection coefficient equal to that of said adjacent optical facet.

23. The injection laser of claim 1, wherein said at least one optical facet comprises one of said reflectors of said optical resonator and subtends an acute angle with said inner surface, said angle of inclination ψ between said optical facet and said plane perpendicular to said longitudinal gain axis being positive and equal to the outflow angle φ, which is equal to arccos ($n_{eff}/n_{RIR}$).

24. The injection laser of claim 1, wherein:
said at least one optical facet subtends an obtuse angle with said inner surface and is oriented such that said angle of inclination ψ between said optical facet and said plane perpendicular to said longitudinal gain axis is negative and is equal to $(\pi/4)-(\phi/2)$ where φ=arccos ($n_{eff}/n_{RIR}$); and
at least part of said outer surface of the radiation inflow region that coincides with a projection of said optical facet formed thereon forms one of said reflectors of the optical resonator.

25. The injection laser of claim 1, wherein:
said at least one optical facet subtends an acute angle with said inner surface and is oriented such that said angle of inclination ψ between said optical facet and said plane perpendicular to said longitudinal gain axis is positive and is equal to $(\pi/4)+(\phi/2)$, where φ=arccos ($n_{eff}/n_{RIR}$); and
at least part of one surface of said injection laser opposite to said inflow region that coincides with a projection of said optical facet formed thereon, forms one of said reflectors of said optical resonator.

26. The injection laser of claim 1, wherein at least one of said optical facets is oriented such that said angle of inclination ψ between said optical facet and said plane perpendicular to said longitudinal gain axis is equal to zero.

27. The injection laser of claim 1, wherein at least one optical facet comprises a reflective coating formed thereon.

28. The injection laser of claim 1, wherein at least one of said reflectors of said optical resonator comprises an external reflector.

29. The injection laser of claim 28, wherein said radiation inflow region comprises two optical facets each optical facet oriented such that said angle of inclination ψ with respect to said plane perpendicular to said longitudinal gain axis is equal to zero.

30. The injection laser of claim 29, wherein at least one of said reflectors of said optical resonator comprises a cylindrical mirror.

31. The injection laser of claim 28, wherein at least one of said reflectors of said optical resonator comprises a plane mirror.

32. The injection laser of claim 28, wherein at least one of said reflectors of said optical resonator comprises a diffraction grating.

33. The injection laser of claim 1, wherein at least one of said reflectors of said optical resonator comprises a spherical mirror.

34. The injection laser of claim 1, comprising at least two gain regions each having a longitudinal gain axis and being disposed adjacent an inner surface of at least one radiation inflow region.

35. The injection laser of claim 34, wherein an independent ohmic contact is formed with each of said gain regions, each ohmic contact positioned opposite said radiation inflow region.

36. The injection laser of claim 34, comprising at least two sequences of gain regions and a common radiation inflow region for each sequence of gain regions, each sequence of gain regions comprising at least two gain regions, said longitudinal gain axis of each gain region in each sequence being parallel to each other and being disposed at right angles to a line of intersection between active layers and an extension of a plane of an optical facet of said common radiation inflow region.

37. The injection laser of claim 36, further comprising ohmic contacts adjoining strips of metallization for respective sequences of gain regions, said strips of metallization formed on at least part of the outer surface of at least one of said common radiation inflow regions.

38. The injection laser of claim 36, further comprising independent ohmic contacts formed with strips of metallization that are positioned parallel to said gain axes of said gain regions and that are insulated from each other, said strips of metallization being located opposite said radiation inflow region.

39. The injection laser of claim 36, wherein said gain regions are formed along at least one line parallel to said longitudinal gain axes of the gain regions.

40. The injection laser of claim 39, wherein:

said radiation inflow region has an outer surface and a thickness $d_{RIR}$, said gain regions having leading edges closest to one side of said heterostructure, said gain regions being separated by a distance equal to $2d_{RIR}/\tan \phi$ when measured from respective leading edges of said gain regions; and at least part of said outer surface coinciding with a projection of said gain region onto it is optically reflective.

41. The injection laser of claim 36, wherein:

at least two adjacent gain regions are electrically isolated by a nonconductive part of said radiation inflow region, and ohmic contacts associated with each of said gain regions are electrically coupled by a metallization layer.

42. The injection laser of claim 1, further comprising at least two gain regions each having longitudinal gain axis and adapted to output light at identical outflow angles $\phi$, said gain region formed on opposite surfaces of said radiation inflow region along two lines that are parallel to each other and to said longitudinal gain axes, said gain regions having leading edges nearest to a common side of said heterostructure, said gain regions on opposite sides of the inflow region being separated by a distance of $d_{RIR}/\sin \phi$ when measured from said leading edges, where $d_{min}$ is the thickness of said radiation inflow.

43. The injection laser of claim 1, further comprising a semiconductor layer formed on said radiation inflow region, said semiconductor layer having a refractive index less than said effective refractive index $n_{eff}$.

44. The injection laser of claim 43, wherein said semiconductor layer has a refractive index approximately equal to $n_{min}$.

45. The injection laser of claim 1, wherein said at least one said gain region flares outward from a portion having a first width to a portion having a second width larger than said first width.

46. The injection laser of claim 1, wherein said at least one gain region comprises at least three gain regions, said at least three gain regions including a middle gain region surrounded by first and second end gain regions.

47. The injection laser of claim 46, wherein one of said cladding layers is thicker along a portion adjacent said middle gain region than along portions adjacent said first and second end gain regions.

48. The injection laser of claim 46, wherein both of said cladding layers has a substantially identical thickness along said middle gain region and said first and second end gain regions.

49. The injection laser of claim 46, wherein said ohmic contacts comprise at at least a first ohmic contact associated with said middle gain region, a second ohmic contact associated with said first end gain region, and a third ohmic contact associated with said second end gain region.

50. The injection laser of claim 46, wherein said ohmic contacts include one continuous ohmic contact associated with the middle gain regain and the first and second end gain regions.

51. The injection laser of claim 46, wherein said radiation inflow region comprises a rectangular parallelepiped.

52. The injection laser of claim 46, further comprising a semiconductor layer having a refractive index less than said effective refractive index $n_{eff}$ formed on said radiation inflow region.

53. The injection laser of claim 46, wherein said at least one radiation inflow region comprises at least one radiation inflow region on each of opposite sides of said active layer.

54. The injection laser of claim 53, further comprising semiconductor layers having refractive indices less than said effective refractive index $n_{eff}$ formed adjacent each of said radiation inflow regions.

55. The injection laser of claim 1, wherein said radiation inflow region comprises two optical facets oriented such that said angle of inclination $\psi$ between said optical facets and said plane perpendicular to said longitudinal gain axis is equal to zero.

* * * * *